(12) United States Patent
Codama

(10) Patent No.: US 6,280,273 B1
(45) Date of Patent: Aug. 28, 2001

(54) ORGANIC EL DISPLAY DEVICE AND METHOD OF MAKING

(75) Inventor: Mitsufumi Codama, Ibaraki (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/548,739

(22) Filed: Apr. 13, 2000

Related U.S. Application Data

(62) Division of application No. 09/192,566, filed on Nov. 17, 1998, now Pat. No. 6,091,078.

(30) Foreign Application Priority Data

Apr. 15, 1998 (JP) .................................................. 10-121736

(51) Int. Cl.[7] .................................................. H01J 9/02
(52) U.S. Cl. .................................................. 445/24
(58) Field of Search .............................. 445/24; 313/504, 313/505

(56) References Cited

U.S. PATENT DOCUMENTS

| | | |
|---|---|---|
| 5,276,380 | 1/1994 | Tang . |
| 5,294,869 | 3/1994 | Tang et al. . |
| 5,302,468 | 4/1994 | Namiki et al. . |
| 5,587,589 | 12/1996 | So et al. . |
| 5,693,962 | 12/1997 | Shi et al. . |
| 5,949,188 * | 9/1999 | Leising et al. .................. 313/505 |

FOREIGN PATENT DOCUMENTS

| | | |
|---|---|---|
| 1-38623 | 11/1989 | (JP) . |
| 5-21158 | 1/1993 | (JP) . |
| 5-258859 | 10/1993 | (JP) . |
| 5-275172 | 10/1993 | (JP) . |
| 8-222371 | 8/1996 | (JP) . |
| 8-262998 | 10/1996 | (JP) . |
| 8-264828 | 10/1996 | (JP) . |
| 8-315981 | 11/1996 | (JP) . |
| 9-134787 | 5/1997 | (JP) . |
| 9-161969 | 6/1997 | (JP) . |
| 9-283280 | 10/1997 | (JP) . |
| 9-330792 | 12/1997 | (JP) . |
| 10-247588 | 9/1998 | (JP) . |

* cited by examiner

Primary Examiner—Kenneth J. Ramsey
(74) Attorney, Agent, or Firm—Oblon, Spivak, McClelland, Maier & Neustadt, P.C.

(57) ABSTRACT

The invention provides an organic EL display device comprising a plurality of organic EL elements each having at least a first electrode, one or more organic layers participating in light emission capability, and a second electrode, the elements being able to be independently electrically operated to emit light, and a groove structure at the boundary between adjacent organic EL elements for isolating at least one of the electrodes between the adjacent organic EL elements. The organic EL display device featuring a greater proportion of light emitting region, higher reliability, a large size of substrate, a more number of elements arrayed in one substrate, and a reduced cost of manufacture is obtained as well as a method for the manufacture thereof.

6 Claims, 16 Drawing Sheets

FIG. 13A
FIG. 13B
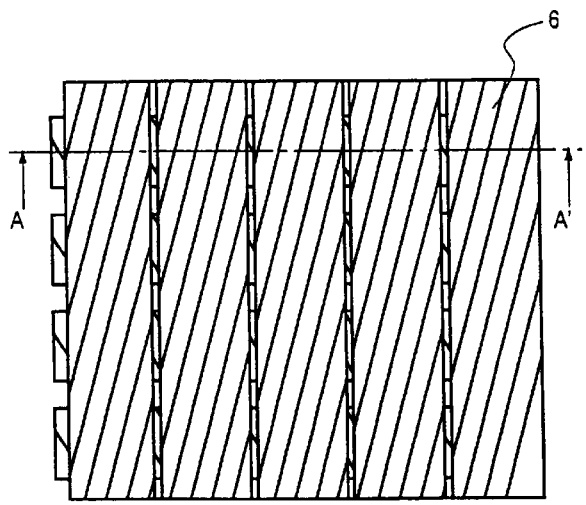
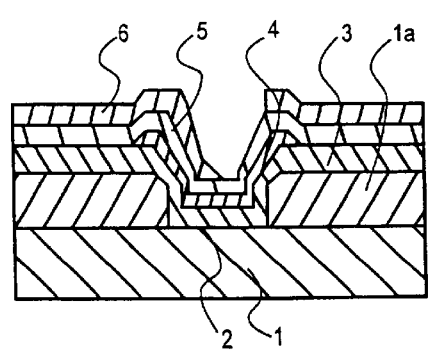
FIG. 14A
FIG. 14B
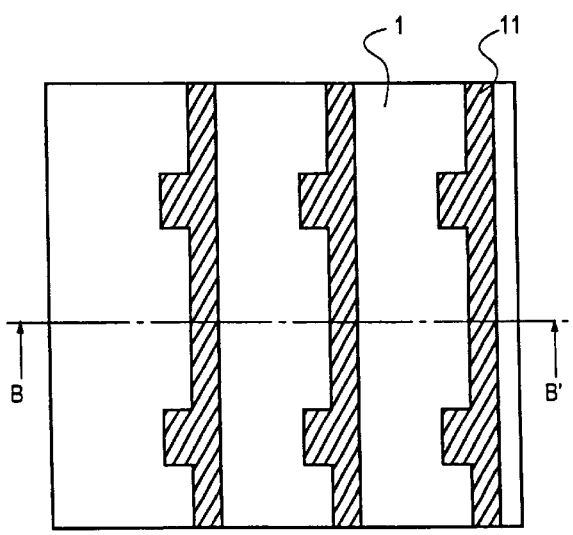
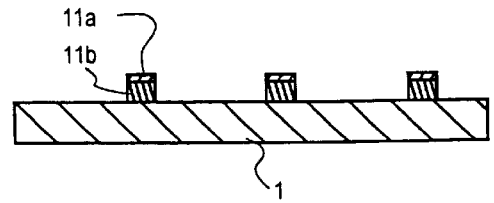

ORGANIC EL DISPLAY DEVICE AND METHOD OF MAKING

This Application is a Divisional of Ser. No. 09/192,566, filed Nov. 17, 1998, now U.S. Pat. No. 6,091,078.

BACKGROUND OF THE INVENTION

1. Technical Field

This invention relates to the structure and preparation of an organic electroluminescent display device (abbreviated as organic EL display device, hereinafter) for use as a display device or light source.

2. Background Art

Display devices which use organic EL elements have the following sorts of advantages over the liquid-crystal displays that currently represent the mainstream in flat panel displays.
1) They are self-emissive, so the viewing angle is wider.
2) Displays only 2–3 mm thick can easily be manufactured.
3) A polarizing plate is not used, so the color of the emitted light is natural.
4) The broad dynamic range in brightness results in a crisp, vibrant display.
5) They operate over a broad range in temperature.
6) The response rate is at least three orders of magnitude faster than liquid-crystal displays, easily enabling the display of moving images.

Despite such superiority, the appearance of organic EL display devices in the market was retarded for the following reason.

In general, organic EL elements include a stack of three thin films having different functions, an electrode in the form of a "transparent conductive film," an "organic layer including a light emitting layer," and another electrode made of a "metal or alloy having a low work function." Difficult problems arose in the manufacture of EL elements, since the "organic layer including a light emitting layer" and "metal or alloy having a low work function" are susceptible to degradation by moisture and oxygen, and the "organic layer including a light emitting layer" is readily soluble in solvents and less resistant to heat. Differently stated, in methods using water, organic solvents and heat, once the "organic layer including a light emitting layer" and a layer of "metal or alloy having a low work function" were formed, it was difficult to isolate and divide the elements. This means that when it is desired to manufacture an organic EL display device of an equivalent class to the currently available display devices realized with liquid crystal, the full-grown semiconductor manufacturing technology and liquid crystal display manufacturing technology cannot be applied without modification.

Under the circumstances, several techniques capable of separating second electrode elements without exposure to the ambient air were devised. With these techniques, it became possible to manufacture highly reliable organic EL displays.

One exemplary method is disclosed in JP-A 275172/1993, JP-A 258859/1993, U.S. Pat. No. 5,276,380, and U.S. Pat. No. 5,294,869. This method utilizes the phenomenon that as shown in FIG. 30, when walls 43 of a height exceeding the thickness of a film 44 constructing the organic EL medium are positioned between display line electrodes to be separated, and a material 41 for organic EL elements is vacuum evaporated from a direction not orthogonal to a surface of a substrate 33, the material 41 is not deposited in the areas shadowed by the walls 43.

However, in order to form light emitting lines of an equal width in satisfactory yields, insulators 42 having a greater width than the walls 43, called electrically insulative strips or pedestals 42, must be formed below the walls 43 as shown in FIG. 30. The reason is that since in the vacuum deposition process, the presence of the walls 43 obstructs the adhesion of an organic film in proximity to the walls 43, a structure without the insulative strips 42 permits short-circuiting to occur between the first and second electrodes in the proximity of the walls 43 where the organic film becomes thin. Then the manufacturing yield becomes extremely low with large sized substrates which make it difficult to improve the thickness uniformity of the organic film.

Inversely, when the insulative strips 42 are formed for the purpose of increasing the manufacturing yield, the width of light emitting lines is restricted by the region where the insulative strips 42 are formed. The width of the insulative strips 42 is designed in accordance with the angle between a metal evaporation source 31 and the substrate 33 and the size of the substrate 33 itself, as shown in FIG. 31, for example. More particularly, as shown in FIG. 31, for example, if the width of the insulative strip 42 is narrow, there arises the problem that the width of light emitting lines varies with the position on the substrate 33 because at position A where the angle between metal atoms traveling from the metal evaporation source 31 to the substrate 33 and the wall 43 is small, as shown in FIG. 32, a film is deposited without problems, but at position B where the angle between metal atoms traveling from the metal evaporation source 31 to the substrate 33 and the wall 43 is large, as shown in FIG. 33, the region shadowed by the wall 43 becomes wider so that the light emitting region becomes narrower. Accordingly, in order to produce light emitting lines of equal width over the entire area of the substrate, the insulative strips must be given a greater width including a margin. Also a margin of at least 3 μm to 5 μm is necessary for the alignment between the insulative strips and the walls when display devices are fabricated on a large sized substrate using an aligner of the full exposure type. However, widening the insulative strips directly incurs a reduction of the light emitting region, which is disadvantageous in achieving a bright display.

Alternative methods are methods of providing isolation between light emitting elements by furnishing cavity structures, trench structures or well structures, and forming light emitting elements in the respective structures, as disclosed in JP-A 262998/1996 and 264828/1996. Apparently, these methods give rise to a similar inconvenient problem.

Further, in methods of forming on an electrode insulative walls having inversely tapered structures, overhang structures or undercut structures as disclosed in JP-A 315981/1996, 283280/1997, and 161969/1997, insulative strips become necessary in actual practice from considerations to form light emitting lines of an equal width in good yields.

SUMMARY OF THE INVENTION

An object of the present invention is to provide an organic EL display device having a greater proportion of light emitting region and high reliability, and enabling use of a large size substrate, fabrication of a number of elements within a substrate, and reduction of manufacturing cost, and a method for preparing the same.

While several structures for isolating elements (which are designated element-isolating structures, hereinafter), including wall structures, cavity structures, trench structures, well structures, inversely tapered structures, overhang structures and undercut structures were proposed in the art, the element-isolating structures are always located closer to a depositing material source than the light emitting elements. On this account, when a display device is manufactured in high yields, insulative strips must be given a margin having a width approximately equal to the height of the element-isolating structures. However, the provision of a greater margin leads to narrowing of the light emitting region, affecting the quality of display. Lowering the height of the element-isolating structures increases the possibility for the "metal electrode having a low work function" to cover the element-isolating structures, which means that the isolation of elements becomes difficult and hence, the manufacturing yield lowers.

For example, when walls of 4 $\mu$m high and 5 $\mu$m wide are formed, the situation is as follows. Since the error of alignment between walls and insulative strips is approximately 5 $\mu$m when a common aligner of the full exposure type is used, the insulative strips must also have a width of 5 $\mu$m in consideration of a margin. Also, where the "organic layer including a light emitting layer" is incident on the substrate from a maximum inclination angle of 45° relative to a direction orthogonal to the substrate, a margin at least equal to the wall height of 4 $\mu$m is necessary in consideration of the shadowed portion. Accordingly, summing the margins on both sides of the wall gives the consequence that the insulative strip must have a width of 23 $\mu$m which is the sum of the width of the wall and all the margins.

If the gap between adjacent transparent conductive films is 5 $\mu$m, in the case of a high-definition simple matrix display having elements arranged at a pitch of 100 $\mu$m, then $(100-23)\times(100-5)\div(100\times100)=0.7315$, indicating that the effective light emitting regions are reduced to about 73%.

The problem essentially originates from the fact that element-isolating structures extend to a substantial extent from the light emitting surface toward the incident direction of deposition materials. If it is possible that a margin be eliminated from the insulative strips and the variation of the light emitting region at the position of the substrate be eliminated, while maintaining high manufacturing yields, then the light emitting region can be widened, and as a result, the manufacture of a high illuminance display device can be realized.

Specifically, the above objects are accomplished by the invention of the following construction.

(1) An organic electroluminescent display device comprising a plurality of organic electroluminescent elements each having at least a first electrode, one or more organic layers participating in light emission capability, and a second electrode, said elements being able to be independently electrically operated to emit light, said device further comprising a groove structure at the boundary between two adjacent organic electroluminescent elements for isolating at least one of the first and second electrodes between said two adjacent organic electroluminescent elements.

(2) The organic electroluminescent display device of (1) wherein said groove structure has a depth which is ½ to 20 times the total thickness of the organic layer and the second electrode layer.

(3) The organic electroluminescent display device of (1) wherein said groove structures has an opening and is provided near at least one side of the opening with an overhang extending generally parallel to a substrate and toward the center of the groove structure.

(4) The organic electroluminescent display device of (1) wherein said overhang is formed near each of opposed sides of the opening of the groove structure.

(5) The organic electroluminescent display device of (1) wherein said groove structure has at its bottom a three-dimensional structure extending orthogonal to a surface of a substrate and having a height which is not higher than the second electrode layer in a light emitting region.

(6) The organic electroluminescent display device of (5) wherein said three-dimensional structure has a width which is greater on the side of an upper end thereof than on the side of the bottom of said groove structure.

(7) The organic electroluminescent display device of (1) wherein a side or opening of said groove structure is at least partially beveled or rounded.

(8) The organic electroluminescent display device of (3) wherein said overhang is made of an insulative material and a portion of said overhang is formed on the substrate or an underlying layer so as to cover a portion of said first electrode.

(9) The organic electroluminescent display device of (3) wherein said overhang is formed at a height of 10 nm to 5 $\mu$m above the opening end of said groove structure.

(10) The organic electroluminescent display device of (3) wherein said overhang formed on the substrate or an underlying layer has a step or edge which is beveled at an angle of up to 45° relative to a deposition surface.

(11) The organic electroluminescent display device of (3) wherein a conductive film having a thickness of up to 2 $\mu$m is formed on at least a partial region of said overhang.

(12) The organic electroluminescent display device of (1) wherein at least a portion of said groove structure is formed in an underlying layer having any one of a color filter layer, a fluorescence conversion layer, and an overcoat layer.

(13) A method for preparing an organic electroluminescent display device comprising the steps of:

forming a groove structure in an insulative substrate or an underlying layer on the substrate, forming a first electrode, forming at least an organic layer participating in light emission capability, and depositing a second electrode, wherein the step of depositing a second electrode uses a process having low step coverage whereby said second electrode is isolated by the resulting groove structure.

(14) The method for preparing an organic electroluminescent display device of (13) wherein said first electrode, said organic layer and said second electrode are formed by a vapor phase deposition process.

(15) The method for preparing an organic electroluminescent display device of (13) wherein said second electrode is formed by oblique evaporation.

(16) The method for preparing an organic electroluminescent display device of (13), further comprising the step of forming an overhang near at least one side of an opening of the groove structure during or after the step of forming a groove structure, said overhang extending generally parallel to the substrate and toward the center of the groove structure.

(17) The method for preparing an organic electroluminescent display device of (13), further comprising the step of forming a three-dimensional structure during the step of forming a groove structure, said three-dimensional structure extending from a bottom of said groove structure and orthogonal to a surface of the substrate and having a height which is not higher than the second electrode layer in a light emitting region.

(18) The method for preparing an organic electroluminescent display device of (16), wherein said overhang is formed using an insulative material, and a portion of said overhang is formed on the substrate or the underlying layer so as to cover a portion of said first electrode.

BRIEF DESCRIPTION OF THE DRAWINGS

FIG. 13A is a plan view illustrating a manufacturing step in Example 2 of the invention, and FIG. 13B is a sectional view taken along lines B–B' in FIG. 13A.

FIG. 14A is a plan view illustrating a manufacturing step in Example 2 of the invention, and FIG. 14B is a sectional view taken along lines B–B' in FIG. 14A.

DESCRIPTION OF PREFERRED EMBODIMENTS

Figure 1:
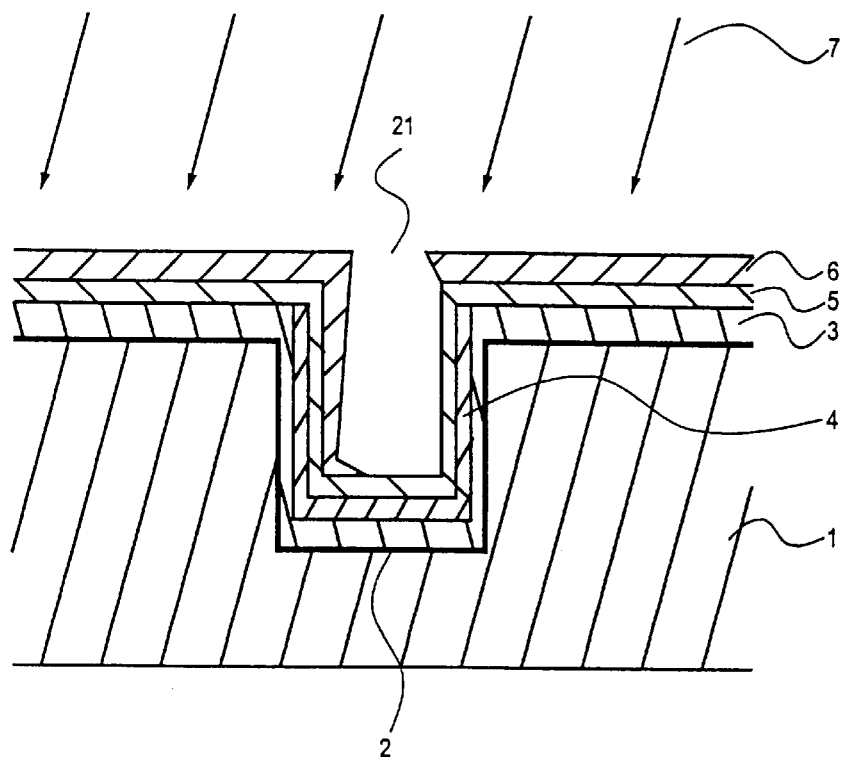
FIG. 1 is a fragmental sectional view of an organic EL display device according to a first embodiment of the invention.

The present invention solves the problems in the following way.

The basic principle is to configure a element-isolating structure so as not to extend high above from a substrate. That is, the means for isolating adjacent elements can be realized by forming a element-isolating structure in which a groove structure isolates adjacent elements, or a element-isolating structure in which the groove structure additionally has a structure for facilitating element isolation. The first electrode elements disposed nearer to the substrate side are formed to cross the grooves or interconnected via another conductive film if necessary. At least the portion of the first electrode crossing the groove is covered with an insulative film so as to avoid short-circuiting with the light emitting layer or second electrode. After such a structure is formed, an organic layer or layers including a light emitting layer are deposited and in sequence, a second electrode is formed in such a manner that the element-isolating structure may not be fully covered.

This procedure eliminates a need for consideration of a portion shadowed by the element-isolating structure because the majority of the light emitting region is located nearer to the depositing material source than the element-isolating structure. That is, the likelihood that the area of the light emitting region is reduced by the height and alignment margin of the element-isolating structure is minimized.

As in the previous example, if a high definition, simple matrix display is assumed in which the gap between adjacent transparent conductive strips is 5 μm, the width of a groove is 5 μm, the margin in forming the insulative film relative to the groove is 5 μm on one side of the groove, and elements are arranged at a pitch of 100 μm, then (100−15)×(100−5) ÷(100×100)=0.8075, indicating that the effective light emitting region is increased about 7%. Further, if the insulative film covering the grooves is patterned in a self-aligning manner, then $(100-5)\times(100-5)\div(100\times100)=0.9025$, indicating that the effective light emitting region beyond 90% is available.

The organic EL display device includes a plurality of organic EL elements which each have at least a hole injecting electrode, an electron injecting electrode, and one or more organic layers participating in light emission function, and which can be independently electrically operated for light emission, and includes a groove structure at the boundary between adjacent organic EL elements for isolating at least one of the electrodes between the adjacent organic EL elements.

The means for isolating adjacent elements can be realized by forming a element-isolating structure in which a groove structure isolates adjacent elements, or a element-isolating structure in which the groove structure additionally has a three-dimensional structure for facilitating element isolation.

That is, the element-isolating structure does not protrude from the deposition surface or light emitting surface toward the direction in which depositing material travels, structural walls and insulative strips become unnecessary, and a wider effective light emitting region is available.

The groove structures may be formed directly in a substrate or in an underlying layer which is formed on the substrate to a predetermined thickness. The size of groove structure which is sufficient to isolate elements is not critical and may be determined as appropriate in accordance with the size of a display device, the size of organic EL elements to be isolated, the thickness of the respective layers to be deposited, depositing methods, and other factors. Illustratively, the groove structure usually has a width of about 1 to 20 $\mu$m, especially about 5 to 10 $\mu$m, and a depth which is about ½ to 20 times, especially about 2 to 10 times, the total thickness of the organic layer and second electrode layer.

The underlying layer is preferably formed using a material which is electrically insulative, can be etched, and does not interfere with the first electrode layer to be deposited thereon. The underlying layer in which the groove structure is formed may also be made of an insulative material having photosensitivity. Illustrative materials are resin materials such as polyimides, acrylic resins, and olefinic resins, and inorganic materials such as $SiO_2$, SiNx, SiON, $Al_2O_3$, and spin-on-glass (SOG) film. The underlying layer may be formed by an appropriate method which is selected from well-known film-forming methods such as evaporation, sputtering, coating, printing and spin coating in accordance with a particular material used.

The groove structure may be formed as a simple U-shaped recess or a recess diverging toward its opening or inversely, a recess diverging toward its bottom. The angle of inclination is not critical although it is preferably ±30° to 60°, especially ±45° relative to the opening direction (or direction orthogonal to the substrate). The groove structure may be provided near its opening with an overhang extending generally parallel to the substrate and toward the center of the groove structure or have an additional structure extending from the bottom in a direction orthogonal to the substrate surface (or upright).

The display device having the element-isolating structure can be fabricated, for example, as follows.

First, a substrate provided with groove structures is furnished. This is achieved by such methods as a method of indenting grooves in an insulative substrate, or a method of forming an underlying layer on an insulative substrate and forming grooves in the underlying layer by photolithography. Also, an auxiliary conductor to be connected to a first electrode may be previously formed below the underlying layer.

Next, the first electrode is formed. The first electrode is formed so as to extend across the groove structures and be electrically connected to regions where adjacent elements are to be formed. To this end, the first electrode is formed by a process having good step coverage or so as to be interconnected via the auxiliary conductor formed under the insulative film beforehand. The first electrode may be patterned by photolithography or a similar technique.

An insulative layer is formed to cover the first electrode formed in the groove structure areas. This is because current leakage is likely to occur between the first electrode and the second electrode in the groove structure areas. Also when the auxiliary electrode is used, the connection portions of the first electrode and the auxiliary electrode is covered with the insulative layer for the same reason. Further, the insulative film formed on the light emitting region of the first electrode is removed by photolithography or a similar technique. The insulative film covering the first electrode in the groove structure areas may be patterned so as to cover the edges of the first electrode strips too, thereby forming a structure capable of suppressing leakage failure at the strip edges.

After the above-described structure is formed, an organic medium or layer including a light emitting layer and participating in at least light emission function is deposited. Subsequently, a second electrode is formed by such a method that the groove structure areas may not be fully covered. The method of not fully covering the groove structure areas is by setting the opening direction of the groove structure (or direction orthogonal to the substrate) at a certain angle with respect to the direction in which depositing particles travel. More particularly, in an evaporation or sputtering process, the substrate is inclined such that the substrate surface may form an angle of not equal to 90° with a line connecting the center of an evaporation source or target and the center of the substrate. In this case, an oblique evaporation process featuring less lateral spread or step coverage is especially preferred. When the direction in which depositing particles travel is set different from the opening direction of the groove structure, a shadow area is defined within the groove structure due to the incident angle of depositing particles and this shadow area becomes an area where no particles are deposited. The incident angle of depositing particles relative to the opening direction of the groove structure is preferably about 10 to 80°, more preferably about 60 to 80°.

Where the groove structure is provided near its opening with an overhang extending toward the center of the groove structure or has an additional structure extending from the bottom, the direction in which depositing particles travel may be set identical with the opening direction of the groove structure.

Further, a metal or insulative film stable to moisture and oxygen may be stacked as a protective film on the second electrode layer.

Figure 31:
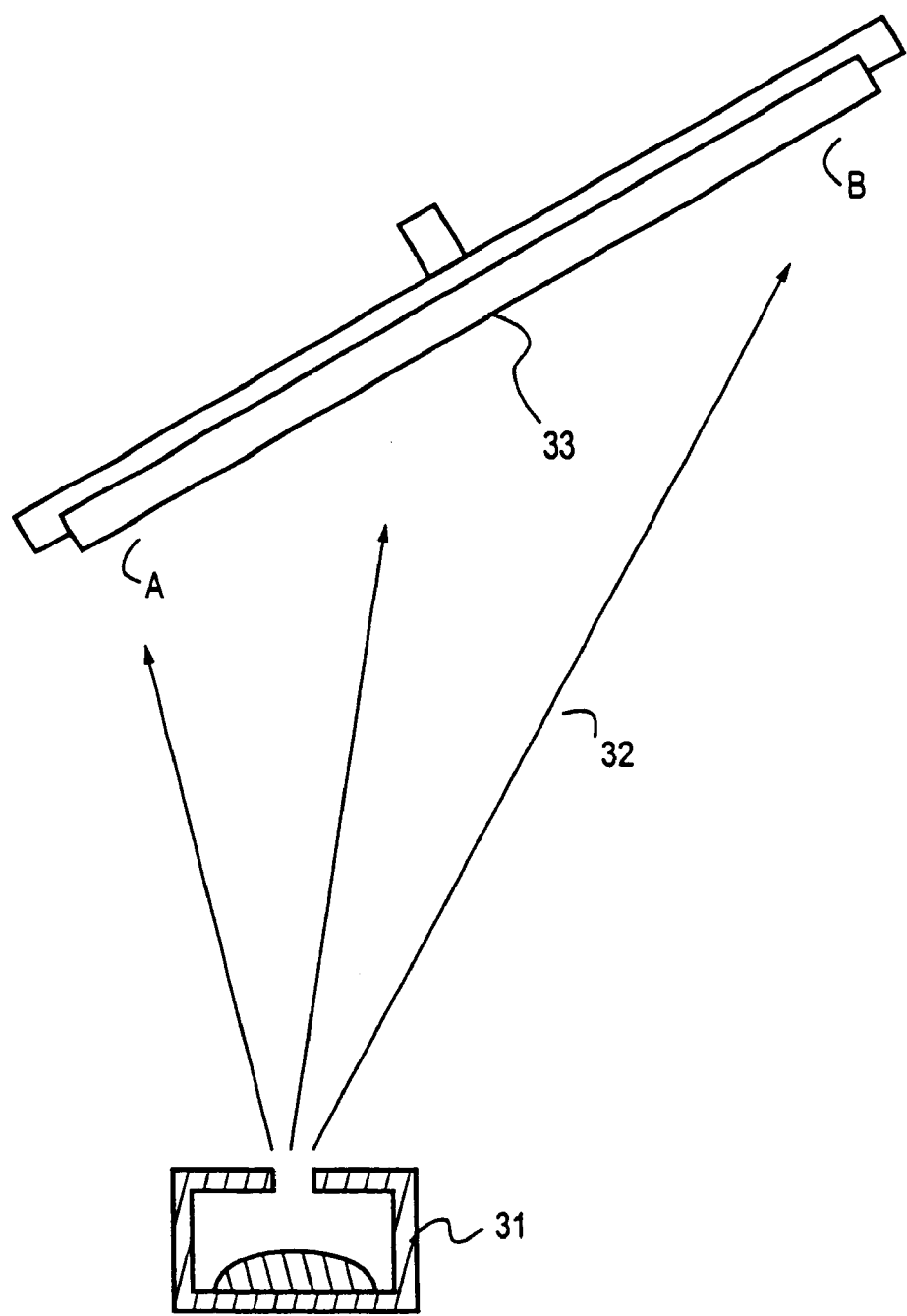
FIG. 31 schematically illustrates the prior art manner of oblique evaporation.
Figure 32:
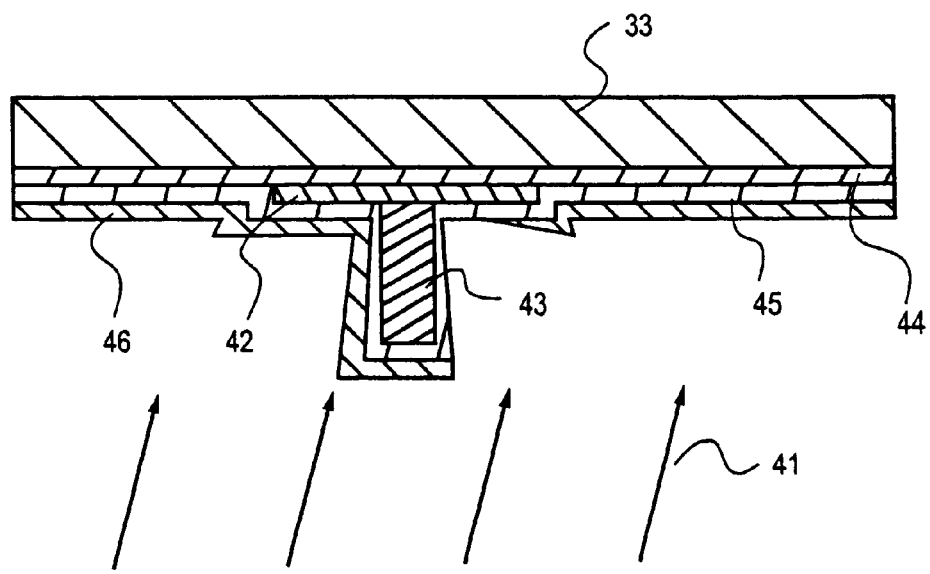
FIG. 32 is a fragmental sectional view illustrating the depositing state at position A in FIG. 31.
Figure 33:
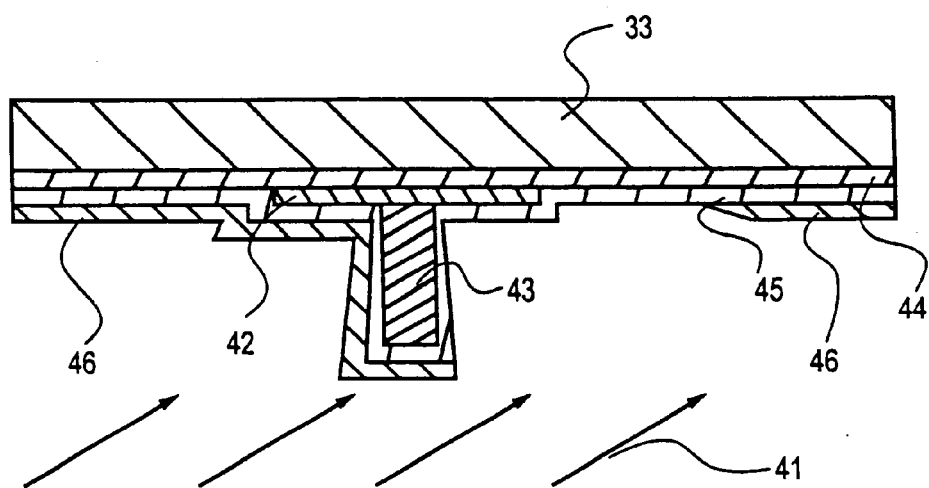
FIG. 33 is a fragmental sectional view illustrating the depositing state at position B in FIG. 31.

It is then understood that even when the angle at which the second electrode material reaches the substrate largely varies during the process, the depositing regions change only within the grooves, and no influence is given to the actual light emitting regions. This means that the invention has a significant advantage when a display device is fabricated using a large size substrate, because there does not arise the phenomenon that as seen from FIG. 33 versus FIG. 32 of the prior art example depicting positions B and A in FIG. 31, the light emitting region is reduced in size due to a different incident angle of depositing particles 41 for the second electrode.

Usually, at least one of the first and second electrodes is formed as a light transmissive film. When the first electrode is a light transmissive film, the insulative film in which grooves are formed may be a color filter or fluorescent filter.

Organic layers including a light emitting layer may be formed by either a vacuum deposition process or a spin coating process. Understandably, when organic layers are formed by spin coating, the grooves should be deep enough so that the groove structures are not completely embedded.

When an auxiliary conductor for the first electrode is formed as demonstrated in Example 2 later, the groove structures can be formed after the formation of the first electrode. The groove structures are desirably formed under such conditions that the surface of the auxiliary conductor is not exposed in the grooves. The auxiliary conductor is desirably of a layer structure including an inexpensive low resistance metal material such as aluminum or aluminum base alloy and a stable conductor such as chromium or TiN stacked thereon. The auxiliary conductor is preferably formed in areas other than the light emitting regions.

When an auxiliary conductor for the second electrode is formed as demonstrated in Example 3 later, the auxiliary conductor is preferably formed after the formation of the insulative layer 4. In this embodiment, the auxiliary conductor for the second electrode is not completely covered with the organic layers and thus partially exposed because of poor step coverage during deposition of the organic layers. Then, when a second electrode layer is formed thereon, electrical contact and conduction between the auxiliary conductor and the second electrode is provided at the exposed areas. The material of which the auxiliary conductor is made is the same as in the case of the auxiliary conductor for the first electrode. The auxiliary conductor is preferably formed in areas other than the light emitting regions, especially on the insulative layer 4.

Now referring to the drawings, the organic EL display device of the present invention is described in further detail.

FIG. 1 is a fragmental sectional view of an organic EL display device according to a first embodiment of the invention. In the figure, the organic EL display device of the invention is illustrated as comprising a substrate 1 of glass or the like which is formed with a groove structure of rectangular or U shape in cross section, and on which a first electrode layer 3 and an insulative layer 4 are formed. The insulative layer provides insulation between the first electrode layer 3 and a second electrode layer for preventing leakage and in the illustrated embodiment, is formed so as to extend to an opening end of the groove structure 2. Deposited on the first electrode layer 3 and the insulative layer 4 is an organic layer 5. On the organic layer 5, a second electrode layer 6 is formed to the illustrated shape when film-forming or depositing particles 7 travel from the arrow direction. The second electrode layer 6 thus formed leaves a non-deposited region within the groove structure 2 whereby two elements are isolated by the groove structure 2.

Figure 2:
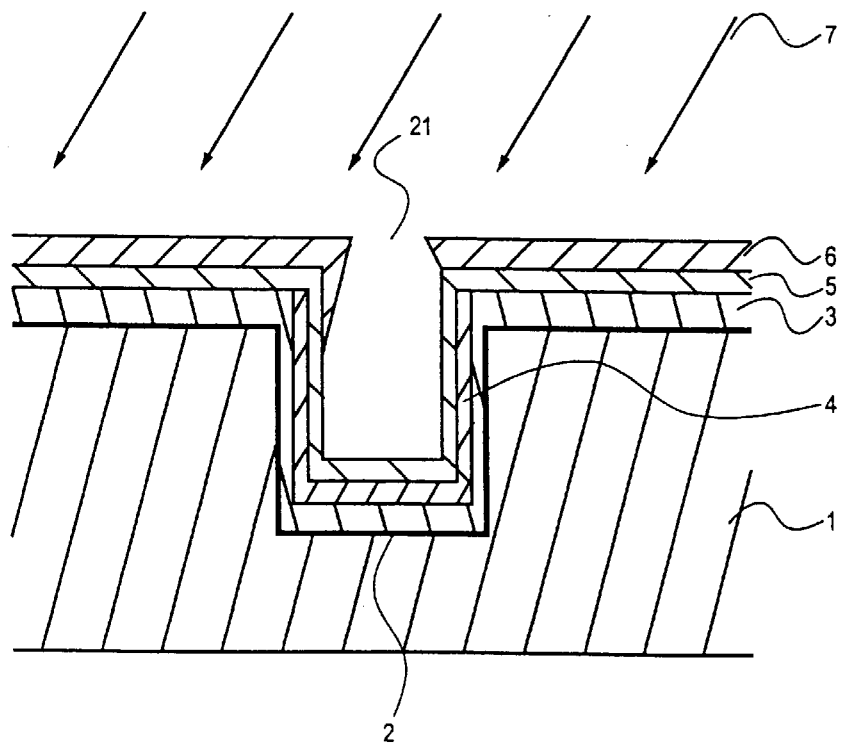
FIG. 2 is a view similar to FIG. 1, illustrating the deposition of a second electrode when the incident direction of depositing particles to a substrate is changed from that of FIG. 1.

FIG. 2 illustrates a second electrode layer which is deposited as in FIG. 1 when the incident angle of depositing particles 7 is changed. As seen from the figure, except that the non-deposited region left within the groove structure differs in size, the change of the incident angle of depositing particles 7 gives no influence on the remaining portion and thus, does not narrow the light emitting regions of the elements.

Figure 3:
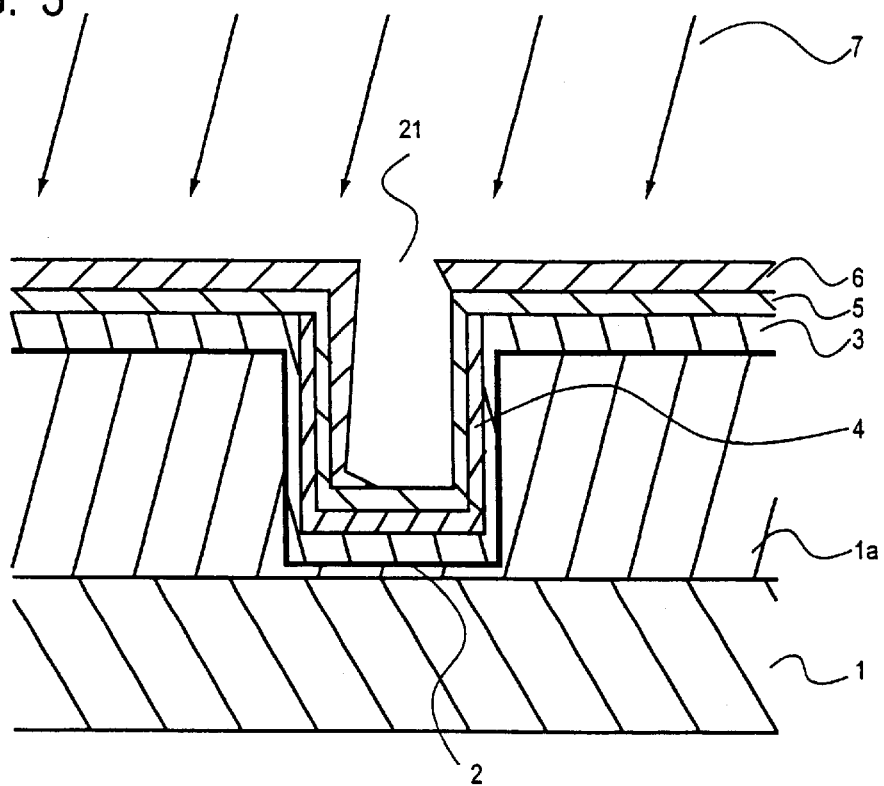
FIG. 3 is a fragmental sectional view of an organic EL display device according to a second embodiment of the invention.

FIG. 3 is a fragmental sectional view of an organic EL display device according to a second embodiment of the invention. In this embodiment, an underlying layer 1a is formed on the substrate 1, and the groove structure 2 is formed in the underlying layer 1a. The groove structure 2 may be formed either by removing a portion of the underlying layer 1a as in the illustrated embodiment or to a depth reaching the substrate 1. The remaining construction is the same as in FIG. 1, and like components are designated by the same numerals and their description is omitted.

Figure 4:
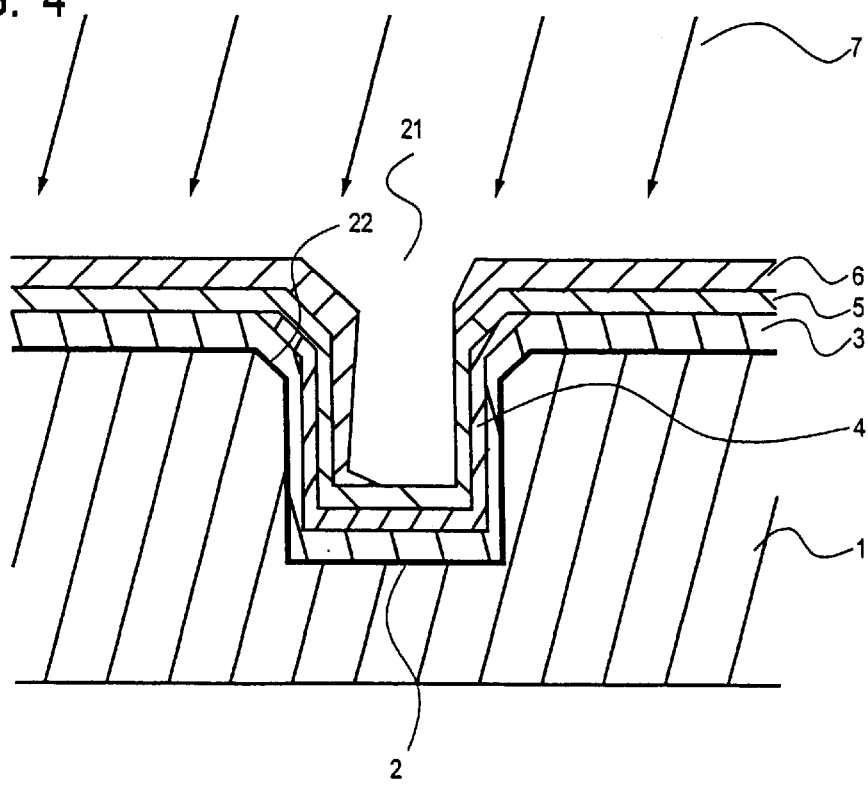
FIG. 4 is a fragmental sectional view of an organic EL display device according to a third embodiment of the invention.

FIG. 4 is a fragmental sectional view of an organic EL display device according to a third embodiment of the invention. This embodiment includes a tapered or beveled edge 22 near an opening of the groove structure 2. The provision of the tapered edge 22 is effective for preventing breaks at the edge or thinning of the first electrode and other layers near the opening and current concentration thereat. The beveled edge 22 preferably has a bevel angle of about 30 to 60 degrees. The beveled edge 22 may also be formed round or curvilinear and if so formed, the round arc preferably has a radius of curvature of 0.5 to 2 $\mu$m, especially about 1 $\mu$m. The site to be beveled or rounded may be a portion of the side or opening of the groove structure, preferably the opening. The remaining construction is the same as in FIG. 1, and like components are designated by the same numerals and their description is omitted.

Figure 5:
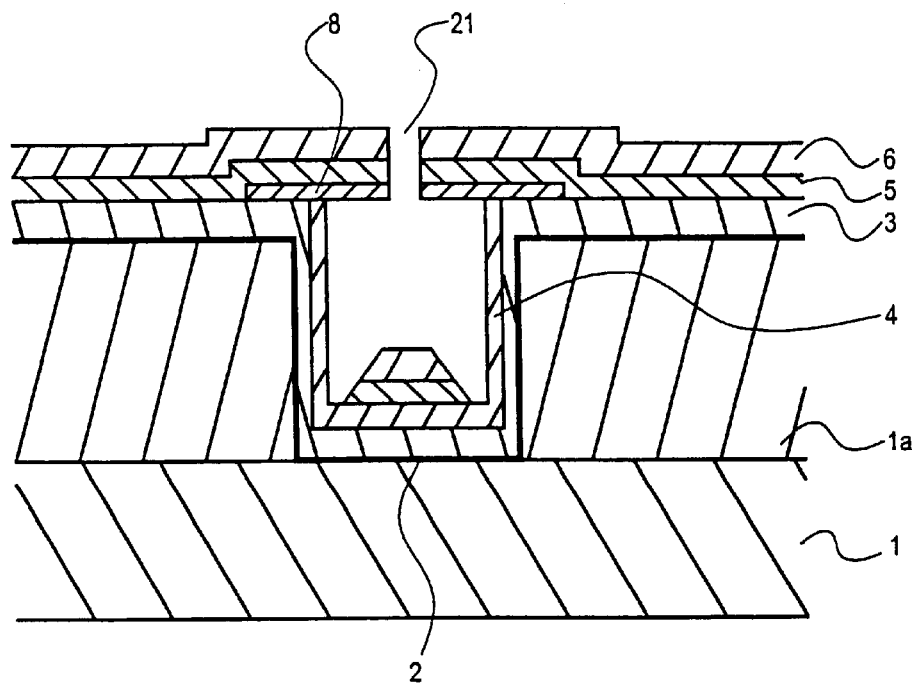
FIG. 5 is a fragmental sectional view of an organic EL display device according to a fourth embodiment of the invention.

FIG. 5 is a fragmental sectional view of an organic EL display device according to a fourth embodiment of the invention. This embodiment includes overhangs 8 near the opening of the groove structure 2 which extend generally parallel to the substrate and toward the center of the groove structure. The groove structure 2 is formed in the underlying layer 1a on the substrate 1. The overhangs 8 are formed like eaves and extend from opposite sides of the opening of the groove structure. The eaves-like overhangs preferably have a thickness of about 10 nm to about 5 $\mu$m.

For example, the overhangs 8 can be formed as follows. First, by application means having good step coverage such as coating or spin coating, a first layer is formed so as to fill the interior of the groove structure 2 therewith. The materials for the first layer are preferably polyimide, SOG film and so on. Then the first layer is removed except for the portion of the first layer within the groove structure 2. A second layer which is to form the overhangs 8 is formed thereon while leaving an aperture 21, whereupon the first layer is removed. The materials for the second layer are preferably resinous materials such as resists, polyimides, acrylic resins, and olefin resins, and inorganic materials such as $SiO_2$, SiNx, SiON, $Al_2O_3$, and SOG (spin-on-glass) film. The remaining construction is the same as in FIG. 1, and like components are designated by the same numerals and their description is omitted.

Figure 6:
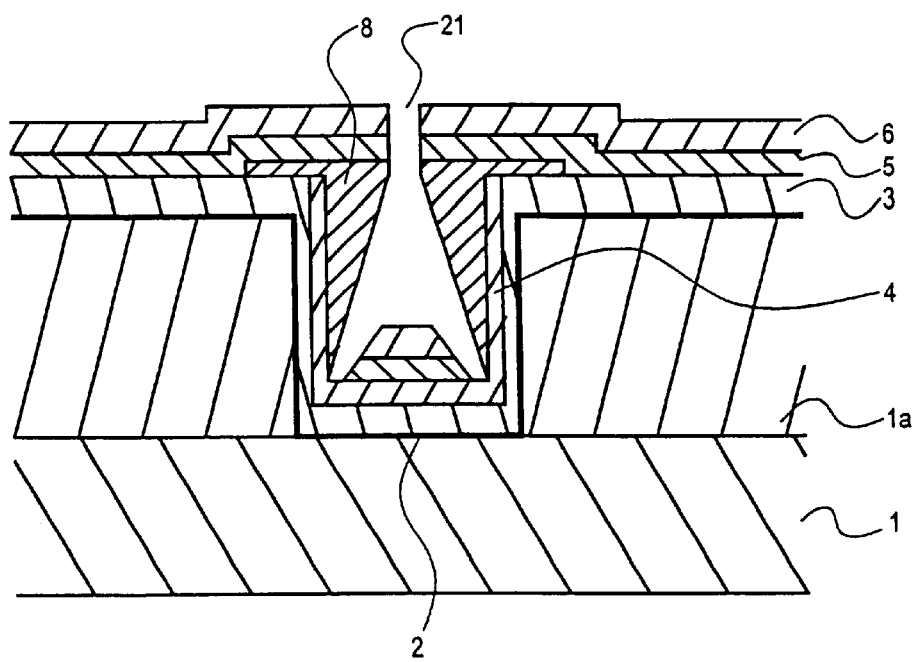
FIG. 6 is a fragmental sectional view of an organic EL display device according to a fifth embodiment of the invention.

FIG. 6 is a fragmental sectional view of an organic EL display device according to a fifth embodiment of the invention. This embodiment includes overhangs 8 near the opening of the groove structure 2 which extend generally parallel to the substrate and toward the center of the groove structure. The overhangs 8 are tapered such that their lateral extension gradually decreases toward the bottom of the groove structure 2. The groove structure 2 is formed in the underlying layer 1a on the substrate 1.

In this embodiment, the overhangs 8 are formed, for example, by forming a first layer so as to fill the interior of the groove structure 2 therewith, forming a second layer while leaving an aperture 21, and etching away a portion of the first layer under properly selected conditions. The remaining construction is the same as in FIG. 5, and like components are designated by the same numerals and their description is omitted.

Figure 7:
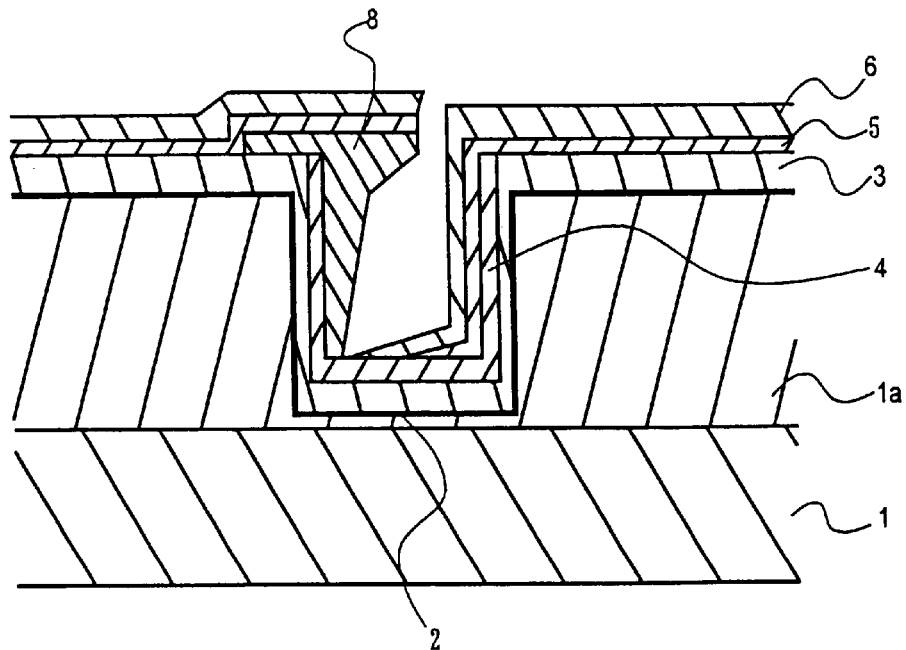
FIG. 7 is a fragmental sectional view of an organic EL display device according to a sixth embodiment of the invention.

FIG. 7 is a fragmental sectional view of an organic EL display device according to a sixth embodiment of the invention. This embodiment includes an overhang 8 near the opening of the groove structure 2 which extends generally parallel to the substrate and toward the center of the groove structure, but from only one side of the opening of the groove structure 2. The overhang 8 is tapered such that its lateral extension gradually decreases toward the bottom of the groove structure 2. The groove structure 2 is formed in the underlying layer 1a on the substrate 1. The remaining construction is the same as in FIG. 6, and like components are designated by the same numerals and their description is omitted.

Figure 8:
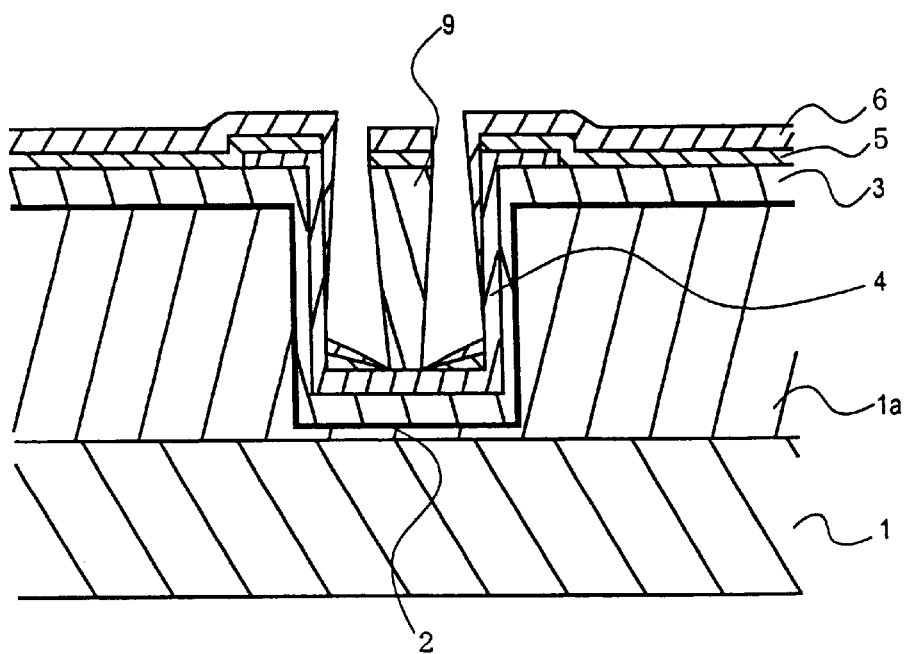
FIG. 8 is a fragmental sectional view of an organic EL display device according to a seventh embodiment of the invention.

FIG. 8 is a fragmental sectional view of an organic EL display device according to a seventh embodiment of the invention. This embodiment includes a structure 9 extending from the bottom of the groove structure 2 toward the opening thereof. The structure 9 may have an equal size both at the bottom and at the opening or be formed so as to dilate toward the opening or the bottom. For effective element isolation, the structure 9 is preferably formed so as to dilate toward the opening. The structure 9 preferably has a height at or below the surface on which element layers are deposited, especially at or below the second electrode layer deposited on areas of the substrate to serve as light emitting regions. Too high the structure 9 can cause some inconvenient problems, for example, that an additional non-deposited region in the second electrode is left at a position other than the groove structure. The remaining construction is the same as in FIG. 1, and like components are designated by the same numerals and their description is omitted. Furthermore, the structure 9 may be a structure having a base on the side of the bottom of the groove structure and an overhang or overhangs on the side of the opening which extend generally parallel to the substrate surface or dilate in width.

The materials of which the structure is made are preferably the same materials as the underlying layer and negative working photosensitive resins. Where the structure has a base and overhangs, the base is preferably made of polyimides or resists and the overhangs are preferably made of resists and photosensitive resins such as photosensitive polyimides.

Next, the organic EL elements of which the organic EL display device of the invention is constructed are described.

According to the invention, the organic EL element includes on a substrate 1 a hole injecting electrode 3 of ITO or the like as the first electrode, at least one organic layer 5 participating in light emission capability, and an electron injecting electrode 6 as the second electrode as shown in FIG. 1, for example. The organic layer may be of a construction including a hole injecting and transporting layer, a light emitting layer, and an electron injecting and transporting layer. Alternatively, an inversely stacked layer construction is employable.

Also acceptable is a construction in which, for example, a first hole injecting electrode of ITO or the like, a first hole injecting layer, a first light emitting layer, a first electron injecting layer, and a first electron injecting electrode are sequentially formed on a substrate; a second electron injecting layer, a second light emitting layer, a second hole injecting layer, and a second hole injecting electrode are sequentially formed thereon; and further a third hole injecting layer, a third light emitting layer, a third electron injecting layer, and a second electron injecting electrode are sequentially formed thereon.

Further acceptable is a construction in which, for example, a first electron injecting electrode, a first electron injecting layer, a first light emitting layer, a first hole injecting layer, and a first hole injecting electrode are sequentially formed on a substrate; a second hole injecting layer, a second light emitting layer, a second electron injecting layer, and a second electron injecting electrode are sequentially formed thereon; and further a third electron injecting layer, a third light emitting layer, a third hole injecting layer, and a second hole injecting electrode are sequentially formed thereon. In this embodiment, the electron injecting electrode or the like is preferably formed to a thickness of up to 100 nm in order to ensure light transmission. The above constructions having plural light emitting layers are suited for full color light emission and white color light emission.

A transparent or translucent electrode is preferred as the hole injecting electrode because the hole injecting electrode is generally formed as a first electrode on the substrate side and permits emitted light to exit therethrough. The transparent electrodes include those of tin-doped indium oxide (ITO), zinc-doped indium oxide (IZO), zinc oxide (ZnO), tin oxide ($SnO_2$), and indium oxide ($In_2O_3$), with ITO and IZO being preferred. The ITO usually contains $In_2O_3$ and SnO in stoichiometry although the oxygen content may deviate somewhat therefrom.

The hole injecting electrode should have at least a sufficient thickness for hole injection and is preferably about 10 to about 500 nm thick, especially about 30 to 300 nm thick. Although no upper limit need be imposed on the thickness of the hole injecting electrode, too thick electrodes can give rise to problems including peeling, poor workability, stress failure, low light transmittance and leakage due to surface roughness. Inversely, a too thin electrode is undesirable in film strength during manufacture, hole transporting capability, and electric resistance.

The hole injecting electrode can be formed by evaporation or other techniques although it is preferably formed by sputtering.

The electron injecting electrode is preferably formed from materials having a low work function, for example, metal elements such as K, Li, Na, Mg, La, Ce, Ca, Sr, Ba, Al, Ag, In, Sn, Zn, and Zr, and binary or ternary alloys made of two or three such metal elements for stability improvement. Preferred alloys are Ag-Mg (Ag: 1 to 20 at %), Al-Li (Li: 0.3 to 14 at %), In-Mg (Mg: 50 to 80 at %), and Al-Ca (Ca: 5 to 20 at %). Alternatively, the electrode may be formed by combining an oxide of such a metal with an auxiliary electrode having good electrical conductivity. It is understood that the electron injecting electrode can be formed by evaporation or sputtering.

The electron injecting electrode thin film may have at least a sufficient thickness for electron injection, for example, a thickness of at least 0.1 nm, preferably at least 1 nm. Although the upper limit is not critical, the electrode thickness is typically about 1 to about 500 nm. On the electron injecting electrode, an auxiliary electrode may be provided.

The auxiliary electrode may have at least a sufficient thickness to ensure efficient electron injection and prevent the ingress of moisture, oxygen and organic solvents, preferably a thickness of at least 50 nm, more preferably at least 100 nm, most preferably 100 to 1,000 nm. A too thin auxiliary electrode would exert its effect little, lose a step coverage capability, and provide insufficient connection to a terminal electrode. If too thick, greater stresses are generated in the auxiliary electrode, accelerating the growth rate of dark spots.

The thickness of the electron injecting electrode and the auxiliary electrode combined is usually about 100 to about 1,000 nm though it is not critical.

After formation of the electrodes, a protective film may be formed in addition to the auxiliary electrode using inorganic materials such as SiOx, and organic materials such as Teflon and chlorine-containing fluorocarbon polymers. The protective film may be transparent or opaque and has a thickness of about 50 to 1,200 nm. The protective film may be formed by conventional sputtering, evaporation and PECVD processes as well as the above-mentioned reactive sputtering process.

Further preferably, a sealing layer may be provided on the element in order to prevent the organic layers and electrodes thereof from oxidation. In order to prevent the ingress of moisture, the sealing layer is formed by attaching a shield plate to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical.

The shield plate is preferably selected from flat plates of transparent or translucent materials such as glass, quartz and resins, with glass being especially preferred. Of these glass materials, alkali glass is preferred from the standpoint of cost although other glass compositions such as soda lime glass, lead alkali glass, borosilicate glass, aluminosilicate glass, and silica glass are also useful. Of these, plates of soda glass without surface treatment are inexpensive and preferred for use. Metal plates and plastic plates may also be used as the shield plate.

A spacer may be used for adjusting the height of the shield plate and holding it at the desired height. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m, with the lower limit of length being usually equal to or greater than the diameter though not critical.

When the shield plate is provided with a recess, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30% by weight, more preferably 0.1 to 5% by weight.

Any of adhesives which can maintain stable bond strength and gas tightness may be used although UV curable epoxy resin adhesives of cation curing type are preferred.

The substrate material is not critical and may be properly selected in accordance with the material of electrodes in an organic EL structure to be stacked thereon. For example, metal materials such as aluminum, and transparent or translucent materials such as glass, quartz and resins may be used. Opaque materials are also acceptable and in this case, ceramics such as alumina, metal sheets of stainless steel or the like which have been surface-oxidized or otherwise insulation treated, thermosetting resins such as phenolic resins, and thermoplastic resins such as polycarbonates may be used.

Next, the organic material layers included in the organic EL elements are described.

The light emitting layer has the functions of injecting holes and electrons, transporting them, and recombining holes and electrons to create excitons. It is preferred that relatively electronically neutral compounds be used in the light emitting layer.

The hole injecting and transporting layer has the functions of facilitating injection of holes from the hole injecting electrode, transporting holes stably, and obstructing electron transportation. The electron injecting and transporting layer has the functions of facilitating injection of electrons from the electron injecting electrode, transporting electrons stably, and obstructing hole transportation. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique although their thickness is usually preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL element contains a fluorescent material that is a compound having a light emitting capability. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the element.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato)(orthocresolato)aluminum(III), bis(2-methyl-8-quinolinolato)(metacresolato)aluminum(III), bis(2-methyl-8-quinolinolato)(paracresolato)aluminum(III), bis(2-methyl-8-quinolinolato)(ortho-phenylphenolato)aluminum(III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis(2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato) aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(ortho-phenylphenolato)aluminum(III), bis(2, 4-dimethyl-8-quinolinolato)(para-phenylphenolato) aluminum(III), bis(2,4 -dimethyl-8-quinolinolato)(meta-phenylphenolato)aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(paraphenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato)aluminum(III).

Also acceptable are bis(2-methyl-8-quinolinolato) aluminum(III)-$\mu$-oxo-bis(2-methyl-8-quinolinolato) aluminum(III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the elements.

The hole injecting and transporting compound and electron injecting and transporting compound used in the mix layer may be selected from compounds for the hole injecting and transporting layer and compounds for the electron injecting and transporting layer to be described later, respectively. Inter alia, the compound for the hole injecting and transporting layer is preferably selected from amine derivatives having strong fluorescence, for example, triphenyl-diamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole injecting and transporting layer, there may be used various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraaryl-benzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO). It is also preferred to use a compound having good thin film forming ability at the hole injecting electrode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer which is optionally provided, there may be used quinoline derivatives including organic metal complexes having 8-quinolinol or a derivative thereof as a ligand such as tris(8-quinolinolato) aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

Of the above-mentioned organic layers, the hole injecting and transporting layer, electron injecting and transporting layer and other layers may be formed of inorganic materials.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of up to 0.2 $\mu$m, especially up to 0.1 $\mu$m. If the grain size is more than 0.2 $\mu$m, especially more than 0.1 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of elements can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

The substrate may be provided with a color filter film, a fluorescent material-containing color conversion film or a dielectric reflecting film for controlling the color of light emission.

The use of the color filter film, fluorescent material-containing color conversion film or dielectric reflecting film as the underlying layer reduces the number of steps because the step of forming the underlying layer in which the groove structure is to be formed can be omitted.

The color filter film used herein may be a color filter as used in liquid crystal displays and the like. The properties of a color filter may be adjusted in accordance with the light emission of the organic EL elements so as to optimize the extraction efficiency and color purity.

It is also preferred to use a color filter capable of cutting external light of short wavelength which is otherwise absorbed by the EL elements materials and fluorescence conversion layer, because the light resistance and display contrast of the elements are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, styryl compounds, and coumarin compounds.

The binder is generally selected from materials which do not cause extinction of fluorescence, preferably those materials which can be finely patterned by photolithography or printing technique. Also, those materials which are not damaged during deposition of ITO or IZO are preferable.

The light absorbing material is used when the light absorption of the fluorescent material is short and may be omitted if unnecessary. The light absorbing material may also be selected from materials which do not cause extinction of fluorescence of the fluorescent material.

When the color filter film, fluorescent material-containing color conversion film or dielectric reflecting film is formed, it is preferred to form an overcoat layer thereon. The overcoat layer is effective for accommodating irregularities of the color filter film, fluorescent material-containing color conversion film or dielectric reflecting film, thereby presenting a smooth surface to ensure the function of the organic EL elements and preventing the quality of display from deteriorating. The materials of which the overcoat layer is made include resin materials such as polyimides, acrylic resins, and olefinic resins, and SOG (spin-on-glass) and analogous materials which can be formed by coating liquid raw materials.

The overcoat layer is generally formed by coating, spin coating or the like. The overcoat layer is formed directly on the substrate to accommodate irregularities on the substrate surface and may serve as the underlying layer as does the color filter film, fluorescent material-containing color conversion film or dielectric reflecting film.

After the color filter film, fluorescent material-containing color conversion film or dielectric reflecting film and the overcoat layer are formed, an inorganic barrier layer may be further formed on these layers. The inorganic barrier layer is effective for preventing ingress of moisture into the organic EL elements from the color filter film, fluorescent material-containing color conversion film or dielectric reflecting film, thereby ensuring the function of the organic EL elements. Illustrative examples are inorganic materials such as $SiO_2$, SiNx, SiON, $Al_2O_3$ and SOG (spin-on-glass) film.

The organic EL device is of the dc or pulse drive type while it can be of the ac drive type. The applied voltage is generally about 2 to 30 volts.

EXAMPLE

Preferred examples of the invention are given below by way of illustration.

Example 1

Figure 9A:
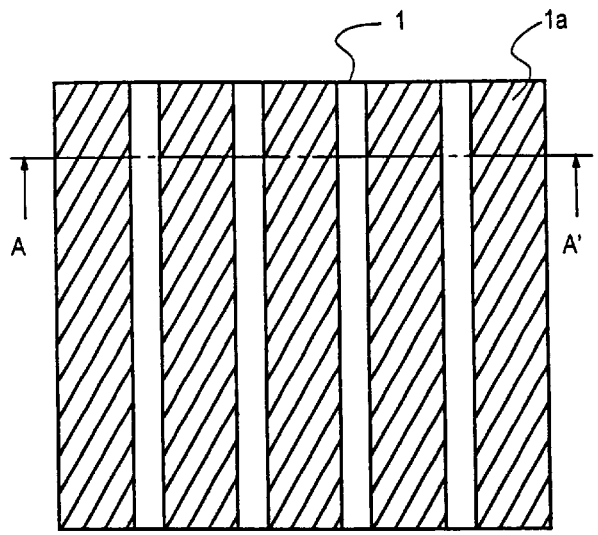
FIG. 9A is a plan view illustrating a manufacturing step in Example 1 of the invention.
Figure 9B:
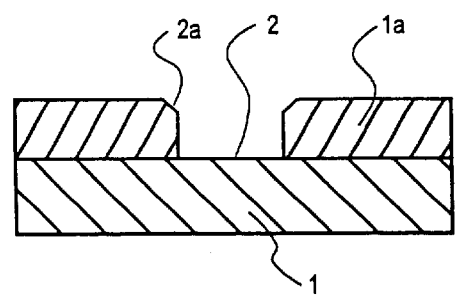
FIG. 9B is a sectional view taken along lines A–A' in FIG. 9A.

As shown in FIGS. 9A and 9B, by an atmospheric pressure CVD process, $SiO_2$ was deposited 0.9 μm on a glass substrate as an insulative film for forming grooves. FIG. 9A is a plan view and FIG. 9B is a view (only a portion depicted) taken along line A–A' in FIG. 9A (the same applies down to FIGS. 13A and 13B). Then, a stripe resist pattern having a line width of 145 μm and a gap width of 3 μm was formed by photolithography, and the $SiO_2$ was etched about 0.9 μm by a reactive ion etching (RIE) process. The etching conditions included an RF power of 2 W/cm$^2$, $CF_4$=80 sccm, and a gas pressure of 100 mTorr (13.3 Pa). Etching was further carried out under such conditions that the resist was also etched: an RF power of 2 W/cm$^2$, $CF_4/O_2$=70/30 sccm, and a gas pressure of 100 mTorr (13.3 Pa). At this point, since the $SiO_2$ was etched while the resist pattern was contracted, a pattern with beveled edges 2a was formed as shown in FIGS. 9A and 9B. The depth of grooves 2 was about three times the total thickness of organic layers including a light emitting layer and a second electrode layer to be deposited later.

Figure 10A:
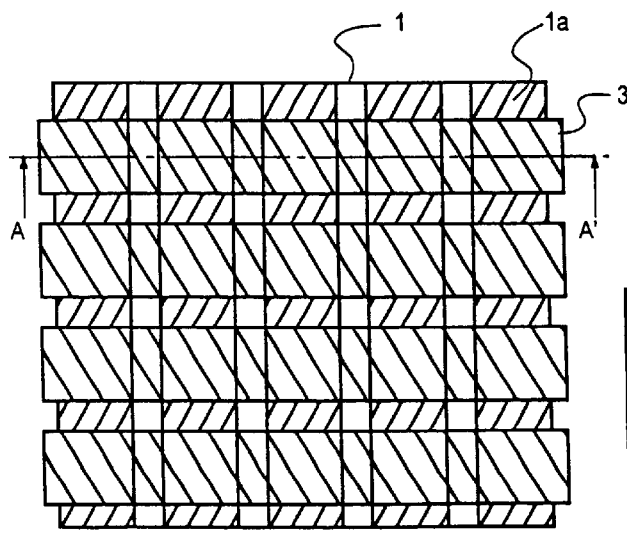
FIG. 10A is a plan view illustrating a manufacturing step in Example 1 of the invention.
Figure 10B:
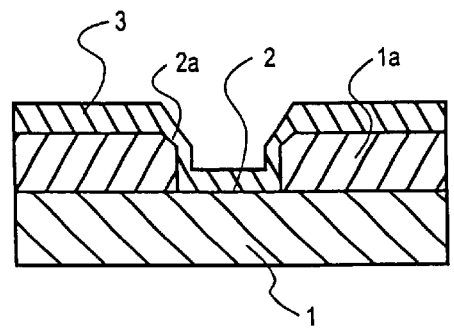
FIG. 10B is a sectional view taken along lines A–A' in FIG. 10A.

Next, as shown in FIGS. 10A and 10B, tin-doped indium oxide (ITO) was deposited 100 nm as a first electrode layer 3 by a sputtering process. In general, the sputtering process can effect film deposition under good step coverage conditions. By setting a gas pressure of 0.3 Pa and a sputtering target-to-substrate distance of 120 mm during sputtering, ITO can be deposited even within the groove structure 2. The ITO was patterned by photolithography into strips extending approximately orthogonal to the strips of $SiO_2$. Etching was carried out with an etchant of $HCl:HNO_3:H_2O$ in a mix ratio of 6:1:19. The resist was peeled off, obtaining a pattern as shown in FIG. 10A.

Figure 11A:
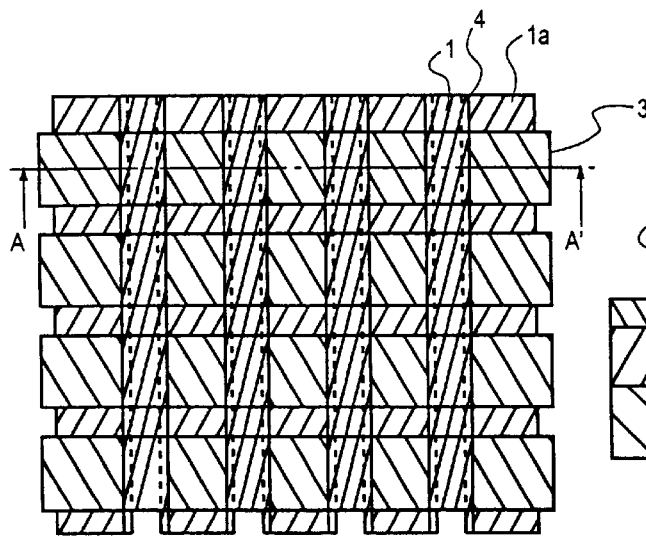
FIG. 11A is a plan view illustrating a manufacturing step in Example 1 of the invention.
Figure 11B:
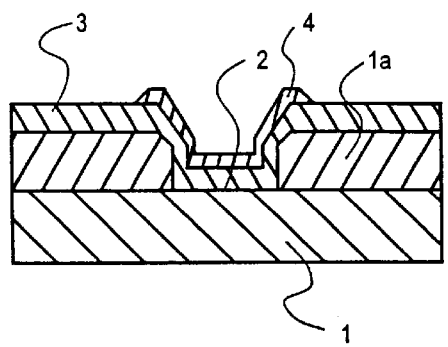
FIG. 11B is a sectional view taken along lines A–A' in FIG. 11A.

Next, as shown in FIGS. 11A and 11B, an $SiO_2$ insulative layer 4 of 0.3 μm thick was formed by an atmospheric CVD process. A resist pattern was formed so that resist steps might have a bevel angle of about 20°, etching was effected by the RIE process under conditions, an RF power of 2 W/cm$^2$, $CF_4/O_2$=70/30 sccm, and a gas pressure of 100 mTorr (13.3 Pa), and the resist was peeled off, obtaining a pattern as shown in FIG. 11A.

Figure 12A:
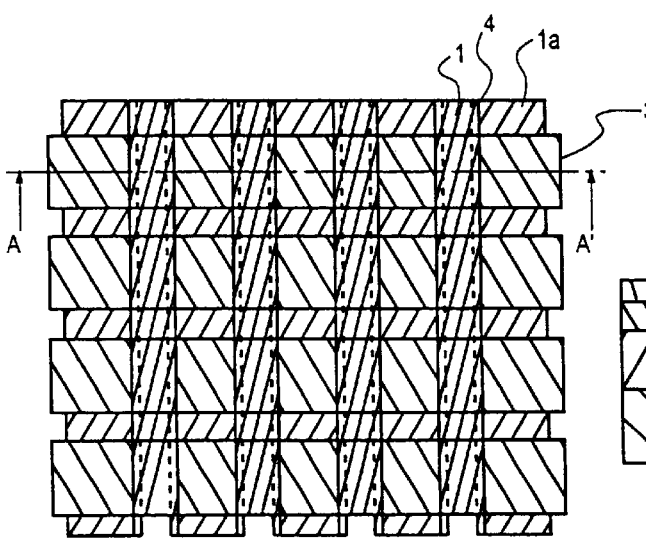
FIG. 12A is a plan view illustrating a manufacturing step in Example 1 of the invention.
Figure 12B:
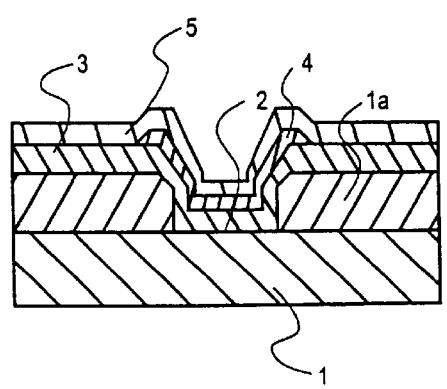
FIG. 12B is a sectional view taken along lines A–A' in FIG. 12A.

Next, as shown in FIG. 12B, organic layers 5 including a light emitting layer were deposited by an evaporation process. While the substrate was being rotated, N,N'-bis(m-methylphenyl)-N,N'-diphenyl-1,1'-biphenyl-4,4'-diamine (abbreviated as TPD, hereinafter) was first deposited as a hole injecting layer and a hole transporting layer, and tris(8-hydroxyquinoline)aluminum (abbreviated as Alq3, hereinafter) was then deposited as a light emitting layer/electron transporting layer. These layers had a thickness of 50 nm and 50 nm, respectively. It is noted that the organic layers were formed over the entire surface and the respective layers are depicted in an integral form in FIG. 12A.

Further in succession, with the vacuum kept, an Mg/Ag alloy (weight ratio 10/1) was evaporated as a second electrode 6 as shown in FIGS. 13A and 13B. The electrode had a thickness of 200 nm. The second electrode was formed by oblique evaporation from a direction approximately orthogonal to the longitudinal direction of the grooves without rotating the substrate, so that the grooves were not fully covered. The second electrode 6 was formed as separate strips isolated by the groove structures 2 as shown in FIG. 13A.

As understood from the spirit of the invention, the invention is not limited to the organic EL element constituting layers and the order of stacking used in this Example. Other materials may be used for the hole injecting layer, light emitting layer and second electrode. Also, a multilayer structure may be constructed by further forming a hole injecting layer, electron transporting layer and electron injecting layer. Differently stated, the invention is applicable independent of the type of material deposited and the structure. Further, an organic light emitting material which can form a film by coating, typically polyphenylene vinylene (PPV) can be used if grooves of a sufficient depth are formed, although the grooves become shallow as the grooves are partially filled due to the flow of the material. Since a coating of the coating type material generally has a thickness of about 100 nm, a groove depth of at least 500 nm is sufficient.

Example 2

This example illustrates the fabrication of a full color display having a diagonal length of 5 inches and a dot number of 640×480×RGB. The size of one dot was as small as 55 μm×165 μm. If element-isolating structures protruding from the surface of a substrate on which elements are to be formed are used, the effective light emitting regions are extremely reduced. The present invention is quite effective when such a fine definition is required.

First, as shown in FIGS. 14A and 14B, on a clean transparent glass substrate, Al-Sc (depicted at 11b) and Cr (depicted at 11a) were continuously deposited to a thickness of 1.5 μm and 0.2 μm, respectively, and patterned by a dry etching process, forming auxiliary conductor strips 11. It is noted that FIG. 14A is a plan view and FIG. 14B is a view (only a portion depicted) taken along line B–B' in FIG. 14A (the same applies down to FIGS. 18A and 18B).

Figure 15A:
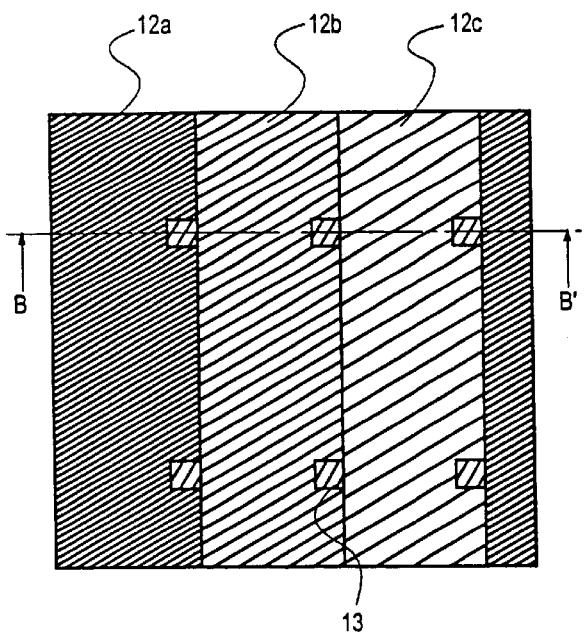
FIG. 15A is a plan view illustrating a manufacturing step in Example 2 of the invention.
Figure 15B:
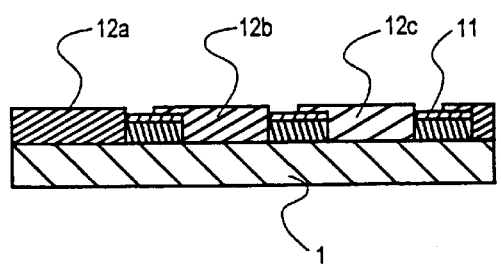
FIG. 15B is a sectional view taken along lines B–B' in FIG. 15A.

Subsequently, as shown in FIGS. 15A and 15B, RED, GREEN, and BLUE color filter layers 12a, 12b, and 12c of the pigment dispersion type were each formed to a thickness of 2.0 μm. These layers, each composed of a pigment dispersed in an acrylic resin, were formed by repeating for each color a process including spin coating a commercially available chemical solution, pre-baking, exposure, development and curing.

Figure 16A:
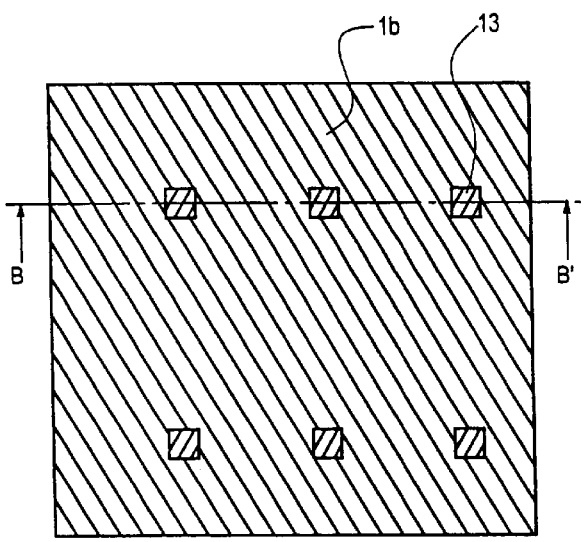
FIG. 16A is a plan view illustrating a manufacturing step in Example 2 of the invention.
Figure 16B:
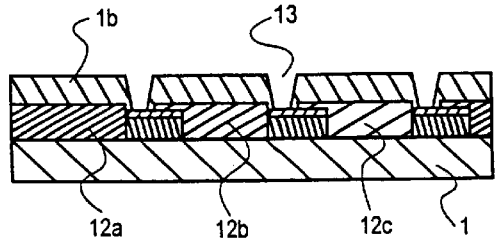
FIG. 16B is a sectional view taken along lines B–B' in FIG. 16A.

Further, as shown in FIGS. 16A and 16B, to flatten the surface of the color filter layers 12a, 12b and 12c, a colorless transparent overcoat layer lb also of an acrylic resin was formed in the same manner as the color filter layers 12a, 12b and 12c. These layers were formed with contact holes 13, through which a first electrode 3 to be subsequently formed could be interconnected to the auxiliary conductor strips 11.

Figure 17A:
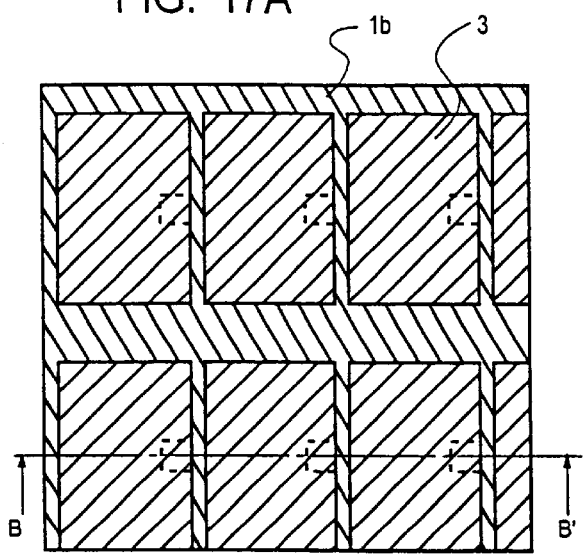
FIG. 17A is a plan view illustrating a manufacturing step in Example 2 of the invention.
Figure 17B:
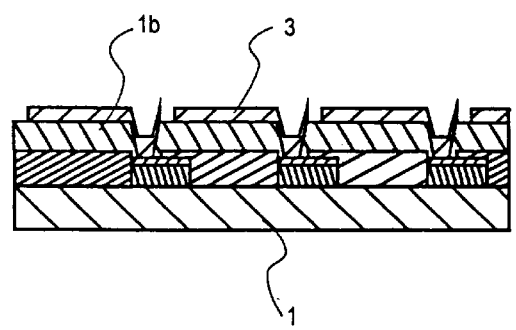
FIG. 17B is a sectional view taken along lines B–B' in FIG. 17A.

Next, as shown in FIGS. 17A and 17B, ITO was deposited as a first electrode 3 as in Example 1. The ITO was positioned so as to be interconnected to the auxiliary conductor strips 11 through the contact holes 13 as described just above. The ITO elements for respective elements were patterned like islands as shown in FIG. 17A.

Figure 18A:
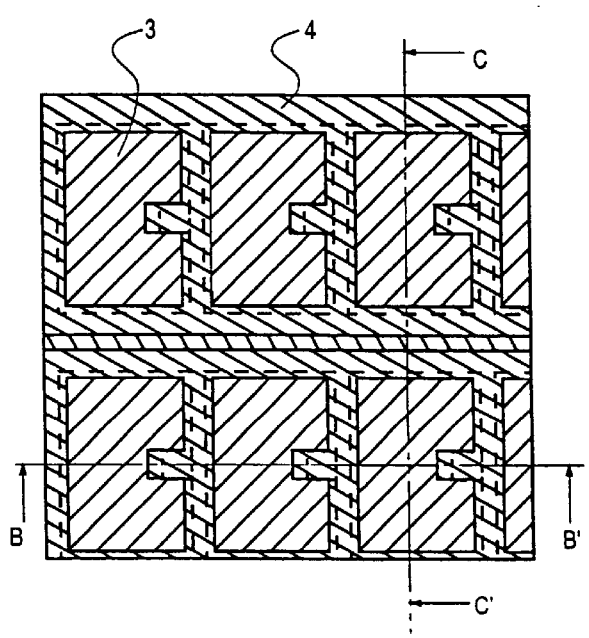
FIG. 18A is a plan view illustrating a manufacturing step in Example 2 of the invention.
Figure 18B:
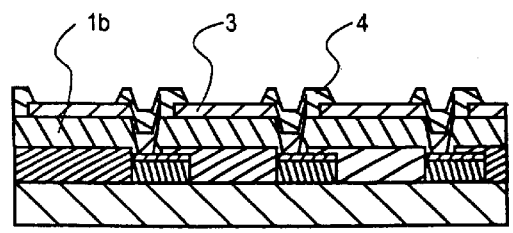
FIG. 18B is a sectional view taken along lines B–B' in FIG. 18A.
Figure 19:
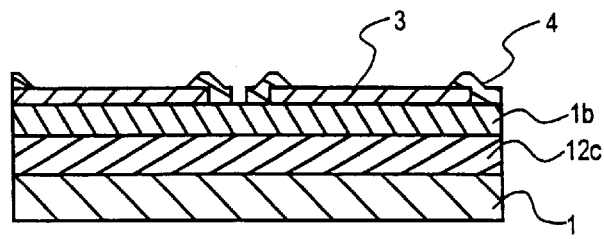
FIG. 19 is a sectional view taken along lines C–C' in FIGS. 18A and 18B illustrating a manufacturing step in Example 2 of the invention.

Further, as shown in FIGS. 18A, 18B, and 19, $SiO_2$ was deposited 300 nm as an insulative layer 4 by sputtering and patterned so as to be left in the contact holes and on opposite sides of areas where grooves were to be formed. It is noted that FIG. 19 is a cross section taken along line C–C' in FIG. 18A. Etching of $SiO_2$ was carried out by a dry etching process so that pattern edges might have a bevel angle of 10° to 30° as shown in FIGS. 18A, 18B, and 19. The etching conditions included an RF power of 2 W/cm$^2$, $CF_4/O_2$=80/20 sccm, a gas pressure of 100 mTorr (13.3 Pa), and a time of 2 minutes. The surface of ITO and the surface of the overcoat film were exposed within the element areas.

Figure 20:
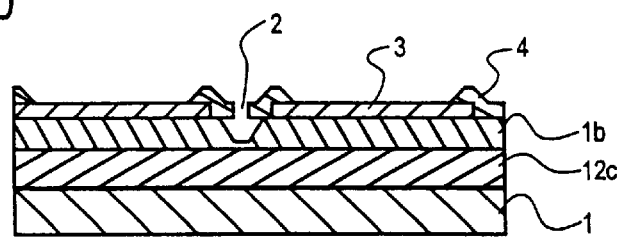
FIG. 20 is a sectional view illustrating a manufacturing step in Example 2 of the invention.

Subsequently, with the vacuum kept, ashing was carried out for 2 minutes at an RF power of 2 W/cm$^2$, $O_2$=100 sccm, a gas pressure of 500 mTorr (66.7 Pa). Since the exposed overcoat film was also ashed away at this point along with the photoresist as shown in FIG. 20, groove structures 2 having not only grooves, but undercuts below the insulative layer 4 were formed. The formation of undercuts in this way enables to electrically isolate adjacent second electrode elements, independent of the incident direction to the substrate of the second electrode material or inter-connecting material to be subsequently deposited. Also, to mitigate leakage failure at steps of ITO, a structure in which steps of ITO were covered with the insulative layer 4 was simultaneously employed in this example. This eliminates a need for an extra step of covering steps of ITO with a new insulative film.

For color imaging, the light emitting elements were constructed by depositing the following materials. In this example, EL materials capable of white color light emission were used.

Poly(thiophene-2,5-diyl) was deposited to a thickness of 10 nm as a hole injecting layer, and TPD doped with 1 wt % of rubrene was co-evaporated to 5 nm as a hole transporting layer/yellow light emitting layer. An appropriate concentration of rubrene is about 0.1 to about 10% by weight because high efficiency light emission occurs at this concentration. The concentration may be determined in accordance with a color balance of emitted light and is governed by the light intensity and wavelength spectrum of a blue light emitting layer to be subsequently deposited. Then, 4,4'-bis[(1,1,2-triphenyl)ethenyl]biphenyl was deposited 50 nm as a blue light emitting layer, and Alq3 was deposited 10 nm as an electron transporting layer, completing an organic layer 5.

Figure 21:
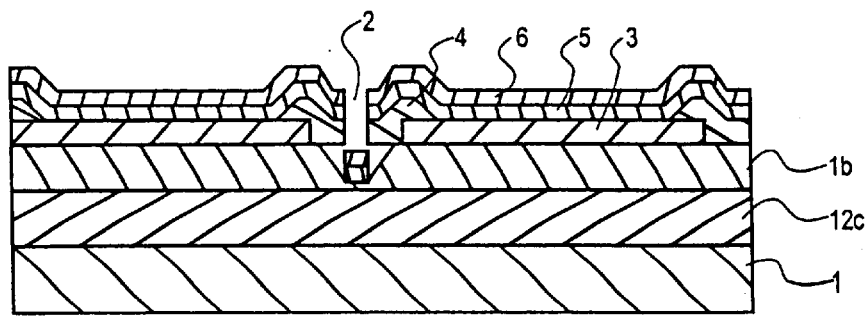
FIG. 21 is a sectional view illustrating a manufacturing step in Example 2 of the invention.

Next, with the vacuum kept, Al-Li alloy and Al were deposited as a second electrode 6 by sputtering. As shown in FIG. 21, even on use of a process having relatively good step coverage such as sputtering, the second electrode elements 6 could be isolated from each other when the groove structures 2 were provided with undercuts.

Finally, a glass plate was joined in a dry nitrogen atmosphere for sealing, completing a display panel.

The thus fabricated display panel was confirmed to produce a bright display and be highly reliable because of deposition without vacuum breakage. with this construction and method, not only second electrode elements in strip form, but second electrode elements in winding form can also be isolated.

Example 3

Figure 22:
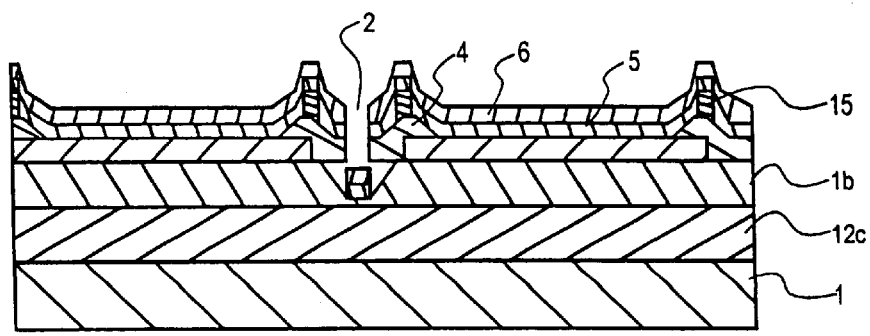
FIG. 22 is a sectional view illustrating a manufacturing step in Example 3 of the invention.

In Example 2, after the insulative layer 4 of $SiO_2$ was formed, Al was successively deposited to 1,500 nm as an auxiliary electrode 15 for the second electrode. A resist pattern was formed and Al was etched with a mixture of phosphoric acid, nitric acid and acetic acid heated at 45° C. In this step, etching was continued for a so long time that aluminum was smaller 2 μm than the resist pattern on each side. As in Example 2, $SiO_2$ was etched, and grooves with undercuts were formed by ashing. In this way, as shown in FIG. 22, the pattern of auxiliary electrode elements 15 of Al which was next smaller than the $SiO_2$ pattern was formed in a self-aligning manner.

Further, yet as in Example 2, an organic layer 5 including a light emitting layer was formed, and a second electrode 6 was deposited 70 nm by sputtering. As shown in FIG. 22, since the auxiliary electrode elements 15 formed on the insulative layer 4 of $SiO_2$ had steps of approximately 90°, the organic layer 5 could not fully cover it, and as a consequence, electrical conduction was established between the auxiliary electrode elements 15 and the second electrode elements 6.

Although the second electrode 6 was so thin that its electrical resistance was not fully low, the auxiliary electrode 15 prevented a voltage drop, enabling imaging with minimal variation over the entire screen.

Example 4

Figure 23:
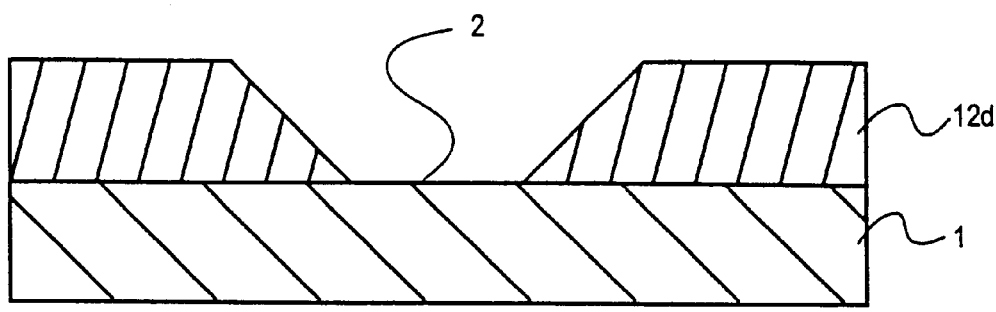
FIG. 23 is a sectional view illustrating a manufacturing step in Example 4 of the invention.
Figure 24:
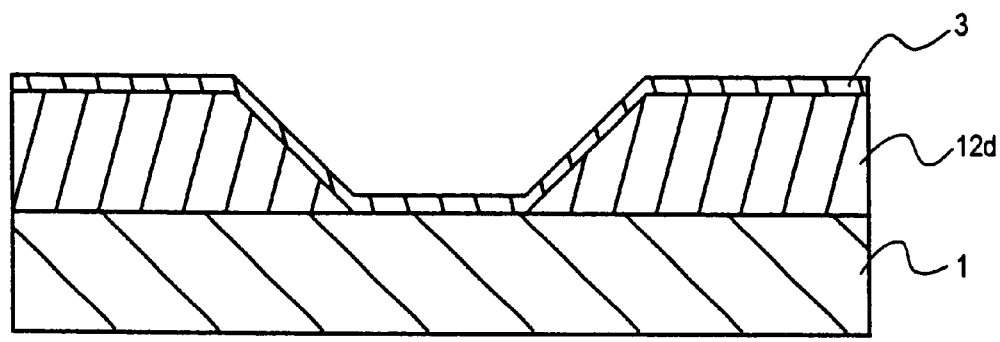
FIG. 24 is a sectional view illustrating a manufacturing step in Example 4 of the invention.
Figure 25:
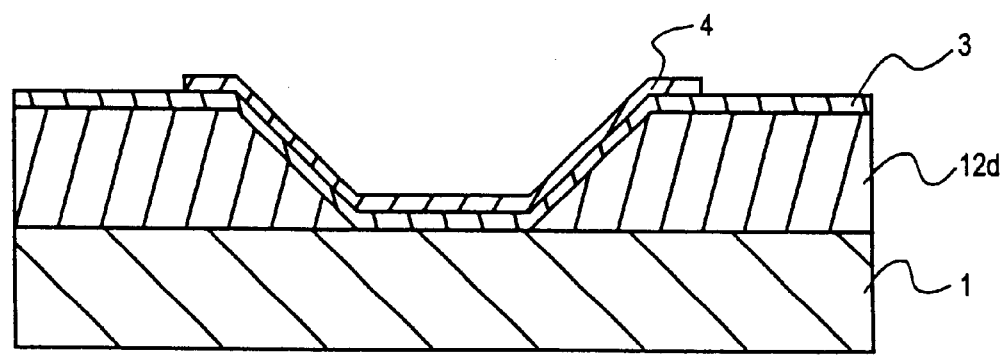
FIG. 25 is a sectional view illustrating a manufacturing step in Example 4 of the invention.

As shown in FIG. 23, a yellow color filter 12d of 2 μm thick was coated on a glass substrate 1 and patterned so as to define a groove structure 2. Then, as shown in FIG. 24, ITO was deposited and patterned as a first electrode 3. Further, as shown in FIG. 25, $SiO_2$ was deposited on the ITO and patterned as an insulative layer 4.

Figure 26:
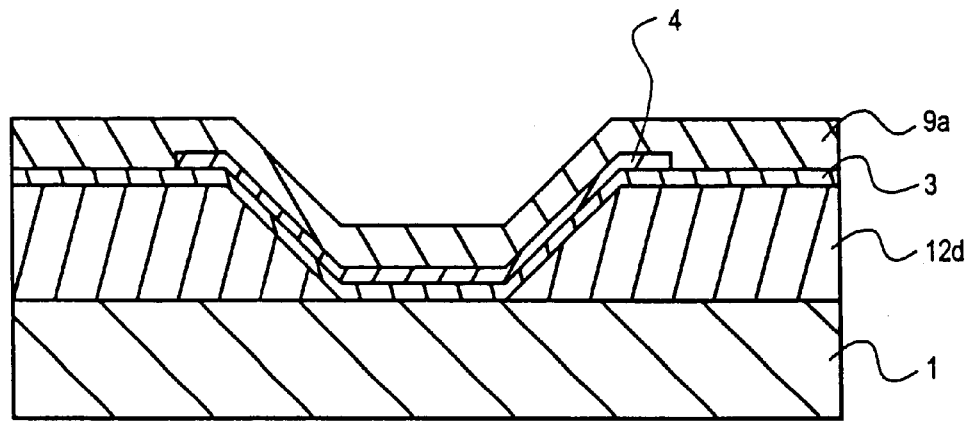
FIG. 26 is a sectional view illustrating a manufacturing step in Example 4 of the invention.
Figure 27:
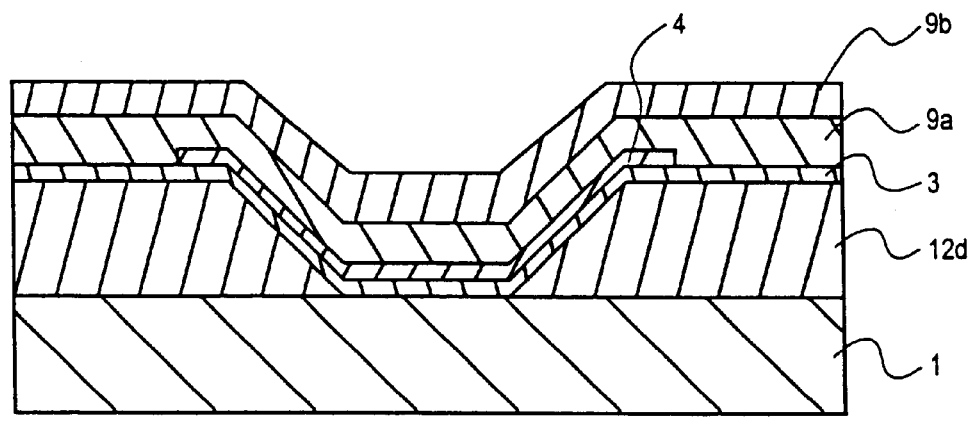
FIG. 27 is a sectional view illustrating a manufacturing step in Example 4 of the invention.
Figure 28:
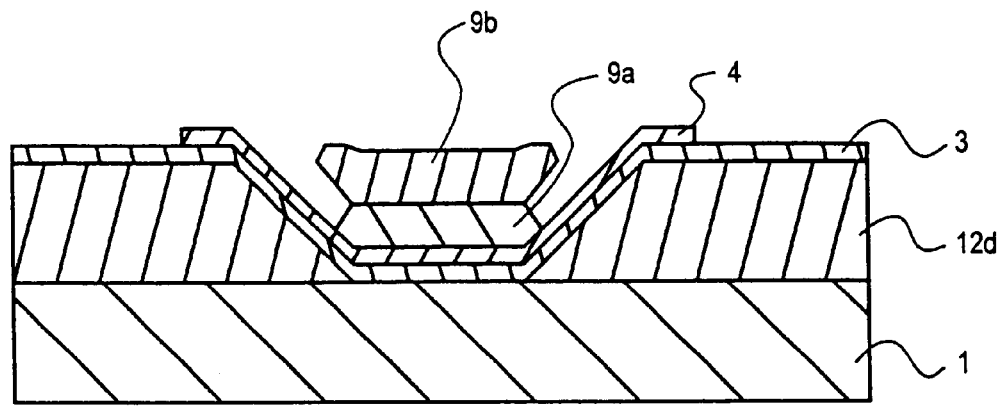
FIG. 28 is a sectional view illustrating a manufacturing step in Example 4 of the invention.

Next, as shown in FIG. 26, polyimide was coated 1 μm and dried for one hour at 120° C. as a structure base 9a. Further, as shown in FIG. 27, a negative resist was coated 1 μm and dried as a structure overhang 9b. Upon exposure from the substrate 1 side, only the portion of the resist within the groove structure 2 was exposed. Upon development, a element-isolating structure 9 having an overhang 9b was formed within the groove structure 2 as shown in FIG. 28.

Example 5

Figure 29:
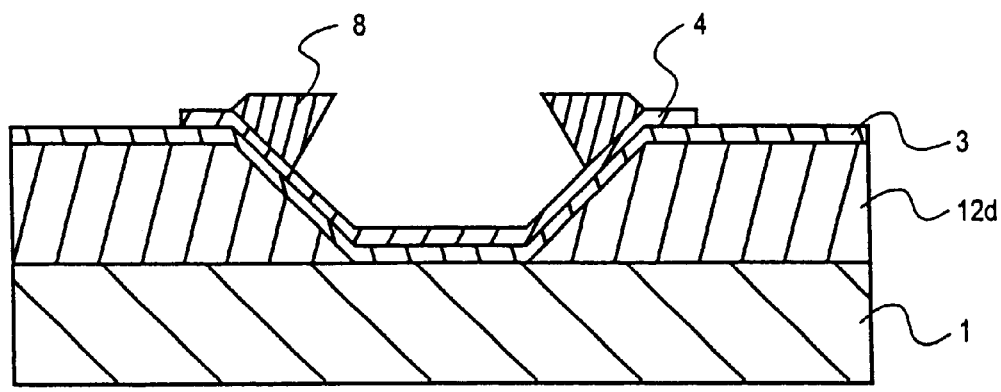
FIG. 29 is a sectional view illustrating a manufacturing step in Example 5 of the invention.
Figure 30:
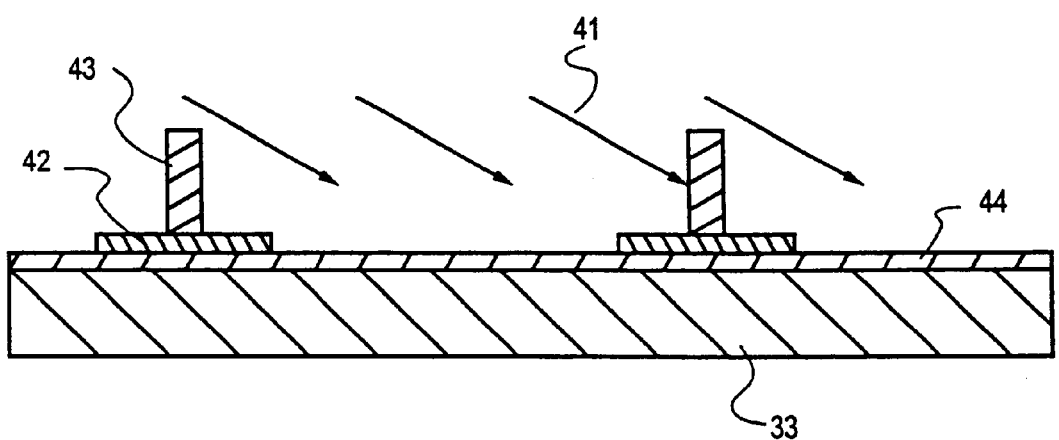
FIG. 30 is a fragmental sectional view illustrating a prior art method of preparing an organic EL display having walls.

As in Example 4, the successive patterns including the insulative layer 4 were formed. Next, a positive resist was coated and dried. After exposure was made through a mask covering the groove structure 2, exposure was also made from the rear side, followed by development. The groove structure 2 having overhangs 8 was formed as shown in FIG. 29 because the bevel walls of the groove structure 2 shielded UV radiation.

As seen from the foregoing Examples, the present invention enables fabrication of organic EL display devices having a larger light emitting surface area and high reliability. The number of manufacturing steps can be reduced as best shown in Example 2, achieving a cost reduction.

According to the invention, organic EL display devices having a larger proportion of light emitting region and high reliability, and enabling use of large sized substrates, fabrication of more elements within a single substrate, and cost effective manufacture are provided as well as the method for manufacturing the same.

What is claimed is:

1. A method for preparing an organic electroluminescent display device comprising the steps of:

forming a groove structure in an insulative substrate or an underlying layer on the substrate, forming a first electrode, forming at least an organic layer participating in light emission capability, and depositing a second electrode, wherein the step of depositing a second electrode uses a process having low step coverage whereby said second electrode is isolated by the resulting groove structure.

2. The method for preparing an organic electroluminescent display device of claim 1 wherein said first electrode, said organic layer and said second electrode are formed by a vapor phase deposition process.

3. The method for preparing an organic electroluminescent display device of claim 1 wherein said second electrode is formed by oblique evaporation.

4. The method for preparing an organic electroluminescent display device of claim 1, further comprising the step of forming an overhang near at least one side of an opening of the groove structure during or after the step of forming a groove structure, said overhang extending generally parallel to the substrate and toward the center of the groove structure.

5. The method for preparing an organic electroluminescent display device of claim 1, further comprising the step of forming a three-dimensional structure during the step of forming a groove structure, said three-dimensional structure extending from a bottom of said groove structure and orthogonal to a surface of the substrate and having a height which is not higher than the second electrode layer in a light emitting region.

6. The method for preparing an organic electroluminescent display device of claim 1, wherein said overhang is formed using an insulative material, and a portion of said overhang is formed on the substrate or the underlying layer so as to cover a portion of said first electrode.

* * * * *

UNITED STATES PATENT AND TRADEMARK OFFICE
CERTIFICATE OF CORRECTION

PATENT NO. : 6,280,273 B1
DATED : August 28, 2001
INVENTOR(S) : Mitsufumi Codama It is certified that error appears in the above-identified patent and that said Letters Patent is hereby corrected as shown below:

<u>Column 24,</u>
Line 26, "display device if claim 1," should read -- display device of claim 4, --.

Signed and Sealed this

Fourteenth Day of May, 2002

Attest:

Attesting Officer

JAMES E. ROGAN
Director of the United States Patent and Trademark Office